US012627279B2

(12) United States Patent
Liu et al.

(10) Patent No.: US 12,627,279 B2
(45) Date of Patent: May 12, 2026

(54) RADIO FREQUENCY ACOUSTIC WAVE DEVICE WITH IMBALANCED RAISED FRAME

(71) Applicant: SKYWORKS GLOBAL PTE. LTD., Singapore (SG)

(72) Inventors: Jiansong Liu, Fremont, CA (US); Kwang Jae Shin, Yongin (KR); Jae Hyung Lee, Seoul (KR); Jong Duk Han, Yongin (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 397 days.

(21) Appl. No.: 17/810,364

(22) Filed: Jul. 1, 2022

(65) Prior Publication Data

US 2023/0006642 A1     Jan. 5, 2023

Related U.S. Application Data

(60) Provisional application No. 63/217,830, filed on Jul. 2, 2021.

(51) Int. Cl.
H03H 9/17 (2006.01)
H03H 9/54 (2006.01)

(52) U.S. Cl.
CPC .............. H03H 9/171 (2013.01); H03H 9/54 (2013.01)

(58) Field of Classification Search
CPC ...... H03H 9/171; H03H 9/54; H03H 9/02118; H03H 9/02157; H03H 9/174; H03H 9/175; H03H 9/132
See application file for complete search history.

(56) References Cited

U.S. PATENT DOCUMENTS 7,358,831 B2     4/2008  Larson, III et al.
7,602,102 B1 *  10/2009  Barber ................... H03H 9/172
                                                  310/320

(Continued)

FOREIGN PATENT DOCUMENTS

CN          111786645 A  * 10/2020  ............... H03H 9/02
JP       2002374144 A      12/2002
                          (Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Andrea Lindgren Baltzell
*Assistant Examiner* — Alan Wong
(74) *Attorney, Agent, or Firm* — Lando & Anastasi, LLP

(57)          ABSTRACT

A bulk acoustic wave resonator device comprises a piezoelectric material layer, a first metal layer having a lower surface disposed on the upper surface of the piezoelectric material layer, a second metal layer having an upper surface disposed on the lower surface of the piezoelectric material layer, and an oxide raised frame disposed between the lower surface of the first metal layer and the upper surface of the second metal layer and surrounding a central active region of the bulk acoustic wave resonator device, the central active region having a first side and a second side, the oxide raised frame having a width on the first side of the central active region that is different from the width of the oxide raised frame on the second side of the central active region to improve an operating parameter of the bulk acoustic wave resonator.

19 Claims, 26 Drawing Sheets

(56)  References Cited

U.S. PATENT DOCUMENTS

| | | | |
|---|---|---|---|
| 9,385,303 B2 | 7/2016 | Song et al. | |
| 9,401,692 B2 * | 7/2016 | Burak et al. | H03H 9/02157 |
| 9,425,764 B2 * | 8/2016 | Burak et al. | H03H 9/02118 |
| 9,444,426 B2 * | 9/2016 | Burak et al. | H03H 9/132 |
| 9,484,882 B2 * | 11/2016 | Burak et al. | H03H 9/175 |
| 9,490,771 B2 * | 11/2016 | Burak et al. | H03H 9/171 |
| 9,577,603 B2 * | 2/2017 | Burak | H03H 9/132 |
| 9,853,626 B2 * | 12/2017 | Burak et al. | H03H 9/132 |
| 9,991,871 B2 * | 6/2018 | Zou | H03H 9/175 |
| 10,284,173 B2 * | 5/2019 | Burak et al. | H03H 9/132 |
| 10,367,472 B2 * | 7/2019 | Burak et al. | H03H 9/175 |
| 10,404,231 B2 * | 9/2019 | Burak et al. | H03H 9/171 |
| 10,608,611 B2 * | 3/2020 | Tajic et al. | H03H 9/131 |
| 10,756,702 B2 * | 8/2020 | Lee | H03H 9/132 |
| 10,812,037 B2 * | 10/2020 | Kyoung et al. | H03H 9/54 |
| 10,897,002 B2 * | 1/2021 | Jeong | H10N 30/87 |
| 11,050,409 B2 * | 6/2021 | Park et al. | H03H 9/54 |
| 11,082,023 B2 * | 8/2021 | Shin | H03H 9/568 |
| 11,190,164 B2 * | 11/2021 | Yen et al. | H03H 9/175 |
| 11,482,985 B2 * | 10/2022 | Fries et al. | H03H 9/54 |
| 11,502,667 B2 * | 11/2022 | Tajic | H03H 9/131 |
| 11,601,112 B2 | 3/2023 | Wang et al. | |
| 11,601,113 B2 | 3/2023 | Wang et al. | |
| 12,244,297 B2 * | 3/2025 | Komatsu | H03H 9/13 |
| 2006/0103492 A1 | 5/2006 | Feng et al. | |
| 2007/0057599 A1 | 3/2007 | Motai et al. | |
| 2008/0024042 A1 | 1/2008 | Isobe et al. | |
| 2008/0174389 A1 | 7/2008 | Mori et al. | |
| 2009/0001848 A1 | 1/2009 | Umeda et al. | |
| 2010/0013573 A1 | 1/2010 | Umeda | |
| 2010/0019866 A1 | 1/2010 | Hara et al. | |
| 2011/0090026 A1 | 4/2011 | Nakahashi et al. | |
| 2011/0180391 A1 | 7/2011 | Larson, III et al. | |
| 2011/0298564 A1 | 12/2011 | Iwashita et al. | |
| 2011/0304412 A1 | 12/2011 | Zhang | |
| 2012/0200195 A1 | 8/2012 | Yokoyama et al. | |
| 2013/0033337 A1 | 2/2013 | Nishihara et al. | |
| 2013/0063227 A1 | 3/2013 | Burak et al. | |
| 2013/0106248 A1 | 5/2013 | Burak et al. | |
| 2013/0140959 A1 | 6/2013 | Shin et al. | |
| 2013/0193809 A1 | 8/2013 | Araki | |
| 2014/0118091 A1 | 5/2014 | Burak et al. | |
| 2014/0118092 A1 | 5/2014 | Burak et al. | |
| 2014/0167566 A1 | 6/2014 | Kando | |
| 2014/0203684 A1 | 7/2014 | Yamamoto et al. | |
| 2014/0203686 A1 | 7/2014 | Song et al. | |
| 2014/0292150 A1 | 10/2014 | Zou et al. | |
| 2014/0339959 A1 | 11/2014 | Lee et al. | |
| 2015/0214923 A1 | 7/2015 | Tsuzuki | |
| 2016/0028371 A1 | 1/2016 | Nishihara et al. | |
| 2016/0118957 A1 | 4/2016 | Burak et al. | |
| 2016/0118958 A1 | 4/2016 | Burak et al. | |
| 2016/0164487 A1 | 6/2016 | Shin et al. | |

| | | | |
|---|---|---|---|
| 2017/0033769 A1 | 2/2017 | Yokoyama | |
| 2017/0093374 A1 | 3/2017 | Yatsenko et al. | |
| 2017/0214388 A1 | 7/2017 | Irieda et al. | |
| 2017/0244021 A1 | 8/2017 | Han et al. | |
| 2017/0244387 A1 | 8/2017 | Matsuda et al. | |
| 2017/0264267 A1 | 9/2017 | Tajic et al. | |
| 2017/0288121 A1 | 10/2017 | Burak et al. | |
| 2017/0288122 A1 | 10/2017 | Zou et al. | |
| 2017/0331457 A1 | 11/2017 | Satoh | |
| 2018/0013401 A1 | 1/2018 | Lee et al. | |
| 2018/0048287 A1 | 2/2018 | Lee et al. | |
| 2018/0085787 A1 | 3/2018 | Burak et al. | |
| 2018/0115302 A1 | 4/2018 | Yeh et al. | |
| 2018/0219528 A1 | 8/2018 | Liu et al. | |
| 2018/0254764 A1 | 9/2018 | Lee et al. | |
| 2018/0278231 A1 | 9/2018 | Hurwitz | |
| 2018/0309427 A1 | 10/2018 | Kim et al. | |
| 2018/0351533 A1 | 12/2018 | Lee et al. | |
| 2019/0036592 A1 | 1/2019 | Shealy et al. | |
| 2019/0115901 A1 | 4/2019 | Takahashi et al. | |
| 2019/0326873 A1 | 10/2019 | Bradley et al. | |
| 2019/0363692 A1 | 11/2019 | Nosaka | |
| 2020/0021273 A1 | 1/2020 | Sung et al. | |
| 2020/0083861 A1 | 3/2020 | Matsuo et al. | |
| 2020/0099359 A1 * | 3/2020 | Shin | H03H 9/02118 |
| 2020/0119713 A1 | 4/2020 | Kim et al. | |
| 2020/0168785 A1 | 5/2020 | Ikeuchi et al. | |
| 2020/0204148 A1 | 6/2020 | Kim et al. | |
| 2020/0274520 A1 | 8/2020 | Shin et al. | |
| 2020/0350888 A1 | 11/2020 | Moulard | |
| 2020/0366266 A1 | 11/2020 | Pollard et al. | |
| 2020/0366271 A1 | 11/2020 | Kim et al. | |
| 2020/0373901 A1 | 11/2020 | Liu et al. | |
| 2020/0373911 A1 | 11/2020 | Wang et al. | |
| 2021/0028765 A1 | 1/2021 | Wang et al. | |
| 2021/0083643 A1 * | 3/2021 | Liu et al. | H03H 9/174 |
| 2022/0311419 A1 | 9/2022 | Komatsu et al. | |
| 2022/0368312 A1 | 11/2022 | Wang et al. | |
| 2022/0393664 A1 | 12/2022 | Liu et al. | |
| 2023/0109382 A1 | 4/2023 | Liu et al. | |
| 2023/0188115 A1 | 6/2023 | Hatano | |
| 2023/0261637 A1 | 8/2023 | Matsuo et al. | |
| 2023/0299744 A1 | 9/2023 | Zhang et al. | |

FOREIGN PATENT DOCUMENTS

| | | | |
|---|---|---|---|
| JP | 2007208845 A | 8/2007 | |
| JP | 2007288645 A | 11/2007 | |
| JP | 2014090414 A | 5/2014 | |
| JP | 2017158160 A | 9/2017 | |
| WO | 2006129532 A1 | 12/2006 | |
| WO | 2007119556 A1 | 10/2007 | |
| WO | 2008126473 A1 | 10/2008 | |
| WO | 2019029912 A1 | 2/2019 | |

* cited by examiner

METAL BOTTOM ELECTRODE INTERCONNECTION 112

PIEZOELECTRIC LAYER 130

IMBALANCED MRaW

CONSTANT ORaW

METAL TOP ELECTRODE INTERCONNECTION 122

200

A — — A'

FREQUENCY(MHz)

FREQUENCY(MHz)

QUALITY FACTOR, Q

MRaW1 = 1.0μm, MRaW2 = 2.6μm
MRaW1 = 2.6μm, MRaW2 = 1.0μm
MRaW1 = 2.6μm, MRaW2 = 5.0μm
MRaW1 = 5.0μm, MRaW2 = 2.6μm

FREQUENCY (MHz)

dB(Y11), RELATIVE@~ANTI-RESONANCE FREQUENCY

RADIO FREQUENCY ACOUSTIC WAVE DEVICE WITH IMBALANCED RAISED FRAME

CROSS-REFERENCE TO RELATED APPLICATIONS

This application claims priority under 35 U.S.C. § 119(e) to U.S. Provisional Patent Application Ser. No. 63/217,830, titled "RADIO FREQUENCY ACOUSTIC WAVE DEVICE WITH IMBALANCED RAISED FRAME," filed Jul. 2, 2021, the entire contents of which is incorporated herein by reference for all purposes.

BACKGROUND

Technical Field

The present disclosure generally relates to bulk acoustic wave resonators.

Description of the Related Art

A bulk acoustic wave resonator is a device having a piezoelectric material disposed between two electrodes. When an electromagnetic signal is applied to one of the electrodes, an acoustic wave is generated in the piezoelectric material and propagates to the other electrode.

Depending on the thickness of the piezoelectric material, resonance of such an acoustic wave is established, and on the other electrode, an electromagnetic signal having a frequency corresponding to the frequency of the resonant acoustic wave is generated. Thus, such a bulk acoustic resonator can be utilized to provide filtering functionality for an electromagnetic signal such as a radio-frequency (RF) signal.

In many applications, the piezoelectric material between the electrodes is relatively thin and implemented as a film. Thus, a bulk acoustic resonator is sometimes referred to as a thin-film bulk acoustic resonator (TFBAR) or as a film bulk acoustic resonator (FBAR).

SUMMARY

In accordance with one aspect, there is provided a bulk acoustic wave resonator device. The bulk acoustic wave resonator device comprises a piezoelectric material layer having an upper surface and a lower surface, a first metal layer having a lower surface disposed on the upper surface of the piezoelectric material layer and an upper surface, a second metal layer having an upper surface disposed on the lower surface of the piezoelectric material layer and a lower surface, and an oxide raised frame disposed between the lower surface of the first metal layer and the upper surface of the second metal layer and surrounding a central active region of the bulk acoustic wave resonator device, the central active region having a first side and a second side, the oxide raised frame having a width on the first side of the central active region that is different from the width of the oxide raised frame on the second side of the central active region to improve an operating parameter of the bulk acoustic wave resonator.

In some embodiments, the bulk acoustic wave resonator device further comprises a metal raised frame disposed on the upper surface of the first metal layer and surrounding the central active region.

In some embodiments, the bulk acoustic wave resonator device further comprises an interconnect electrically coupled to the first metal layer disposed on the first side of the central active region on an opposite side of the metal raised frame from the central active region, and an interconnect electrically coupled to the second metal layer disposed on the second side of the central active region on an opposite side of the metal raised frame from the central active region.

In some embodiments, the metal raised frame has a width on the first side of the central active region that is substantially the same as a width of the metal raised frame on the second side of the central active region.

In some embodiments, the width of the oxide raised frame on the second side of the central active region is greater than the width of the oxide raised frame on the first side of the central active region.

In some embodiments, the central active region includes at least one additional side, the width of the oxide raised frame on the at least one additional side of the central active region being substantially the same as the width of the oxide raised frame on the second side of the central active region.

In some embodiments, the width of the metal raised frame on the first side of the central active region is greater than the width of the oxide raised frame on the first side of the central active region.

In some embodiments, the width of the metal raised frame on the first side of the central active region is different from the width of the metal raised frame on the second side of the central active region.

In some embodiments, the width of the metal raised frame on the first side of the central active region is greater than the width of the metal raised frame on the second side of the central active region.

In accordance with another aspect, there is provided a bulk acoustic wave resonator device. The bulk acoustic wave resonator device comprises a piezoelectric material layer having an upper surface and a lower surface, a first metal layer having a lower surface disposed on the upper surface of the piezoelectric material layer and an upper surface, a second metal layer having an upper surface disposed on the lower surface of the piezoelectric material layer and a lower surface, and a metal raised frame disposed on the upper surface of the first metal layer and surrounding a central active region of the bulk acoustic wave resonator device, the central active region having a first side and a second side, the metal raised frame having a width on the first side of the central active region that is different from a width of the metal raised frame on the second side of the central active region to improve an operating parameter of the bulk acoustic wave resonator.

In some embodiments, the bulk acoustic wave resonator device further comprises an oxide raised frame disposed between the lower surface of the first metal layer and the upper surface of the second metal layer and surrounding the central active region of the bulk acoustic wave resonator device.

In some embodiments, the bulk acoustic wave resonator device further comprises an oxide raised frame disposed between the lower surface of the first metal layer and the upper surface of the second metal layer and surrounding the central active region of the bulk acoustic wave resonator device, the oxide raised frame having a width on the first side of the central active region that is different from a width of the oxide raised frame on the second side of the central active region.

In some embodiments, the bulk acoustic wave resonator device further comprises an interconnect electrically coupled to the first metal layer disposed on the first side of the central active region on an opposite side of the metal raised frame from the central active region, and an interconnect electrically coupled to the second metal layer disposed on the second side of the central active region on an opposite side of the metal raised frame from the central active region.

In some embodiments, the oxide raised frame has a width on the first side of the central active region that is substantially the same as a width of the oxide raised frame on the second side of the central active region.

In some embodiments, the width of the metal raised frame on the second side of the central active region is greater than the width of the metal raised frame on the first side of the central active region.

In some embodiments, the central active region includes at least one additional side, the width of the metal raised frame on the at least one additional side of the central active region being substantially the same as the width of the metal raised frame on the second side of the central active region.

In some embodiments, the width of the oxide raised frame on the first side of the central active region is greater than the width of the metal raised frame on the first side of the central active region.

In some embodiments, the width of the oxide raised frame on the first side of the central active region is different from the width of the oxide raised frame on the second side of the central active region.

In some embodiments, the width of the oxide raised frame on the second side of the central active region is greater than the width of the oxide raised frame on the first side of the central active region.

Any of the above embodiments of the bulk acoustic wave resonator device may be included in a radio frequency filter. The radio frequency filter may be included in a radio frequency module. The radio frequency module may be included in a radio frequency device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
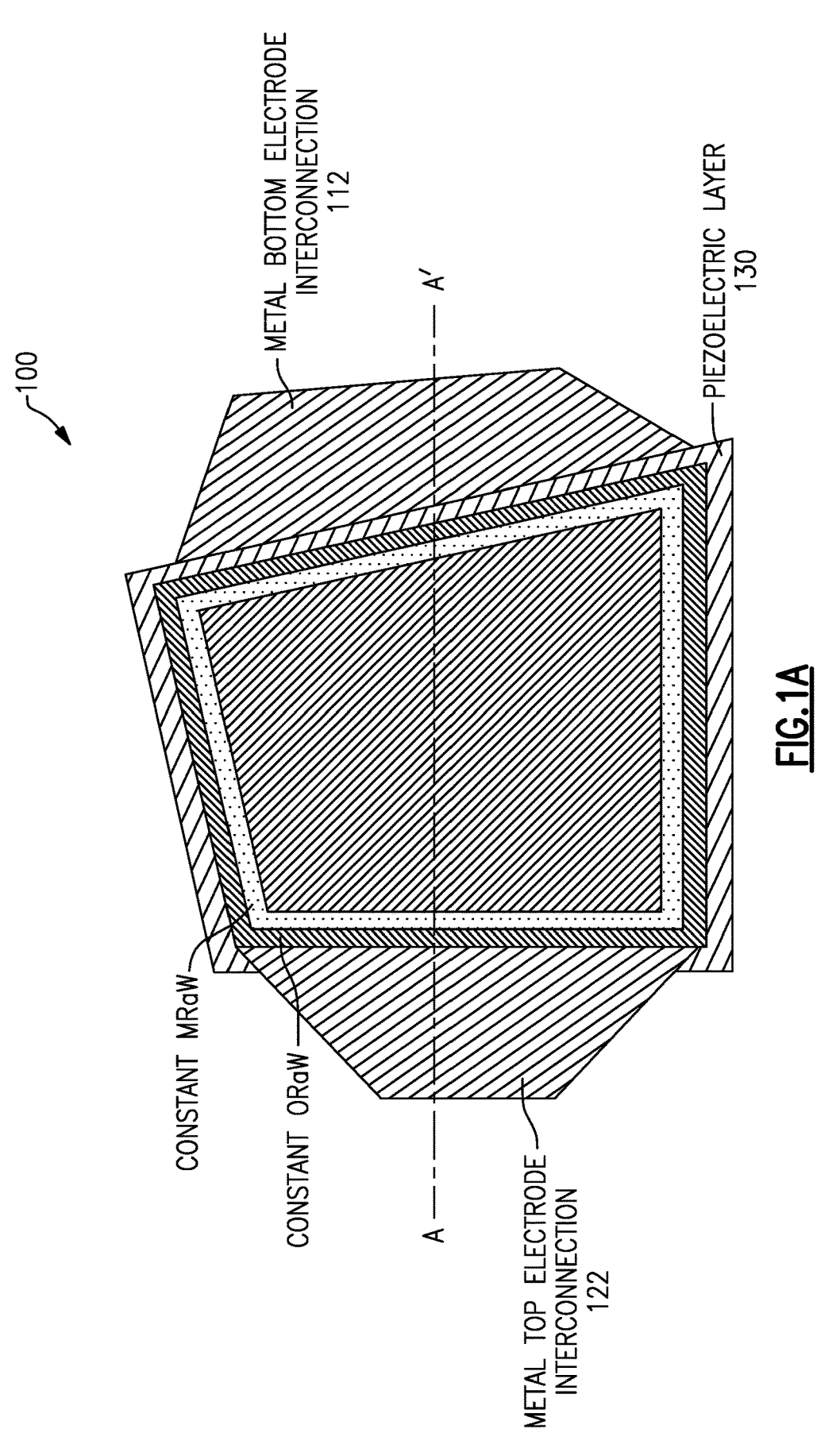
FIG. 1 is a plan view of an example of a FBAR.
FIG. 1B is a cross-sectional view of the example FBAR of FIG. 1 along line A-A'.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Described herein are various examples related to film bulk acoustic resonators (FBARs) and related devices having an improved quality factor Q and/or improved electromagnetic coupling factor $k^2$. For example, FBARs and related devices described herein can have increased mode reflection and reduced mode conversion. Although such examples are described in the context of FBARs, it will be understood that one or more features of the present disclosure can also be implemented in other types of resonators, including solidly mounted resonators (SMRs) or devices that are similar to FBARs but referred to in different terms.

According to certain aspects, FBARs can include a raised frame to improve quality factor Q above a resonance frequency fs. Generally, in FBARs, leakage of laterally propagating modes out of an active region can cause the quality factor Q to decrease. In addition, mode conversion from the main mode to lateral modes can also cause the quality factor Q to decrease. A raised frame can act as a reflector that reflects lateral modes back to the active region and can improve the quality factor Q. However, having only one raised frame may not be sufficient to reflect all the lateral modes. To strengthen the reflection and achieve maximum mode reflection, one may form multiple reflectors, such as two or more raised frames, for example, by forming different unmatched acoustic impedance interfaces. However, forming multiple reflectors can create a number of discontinuous boundaries, which can increase mode conversion.

Figure 1B:
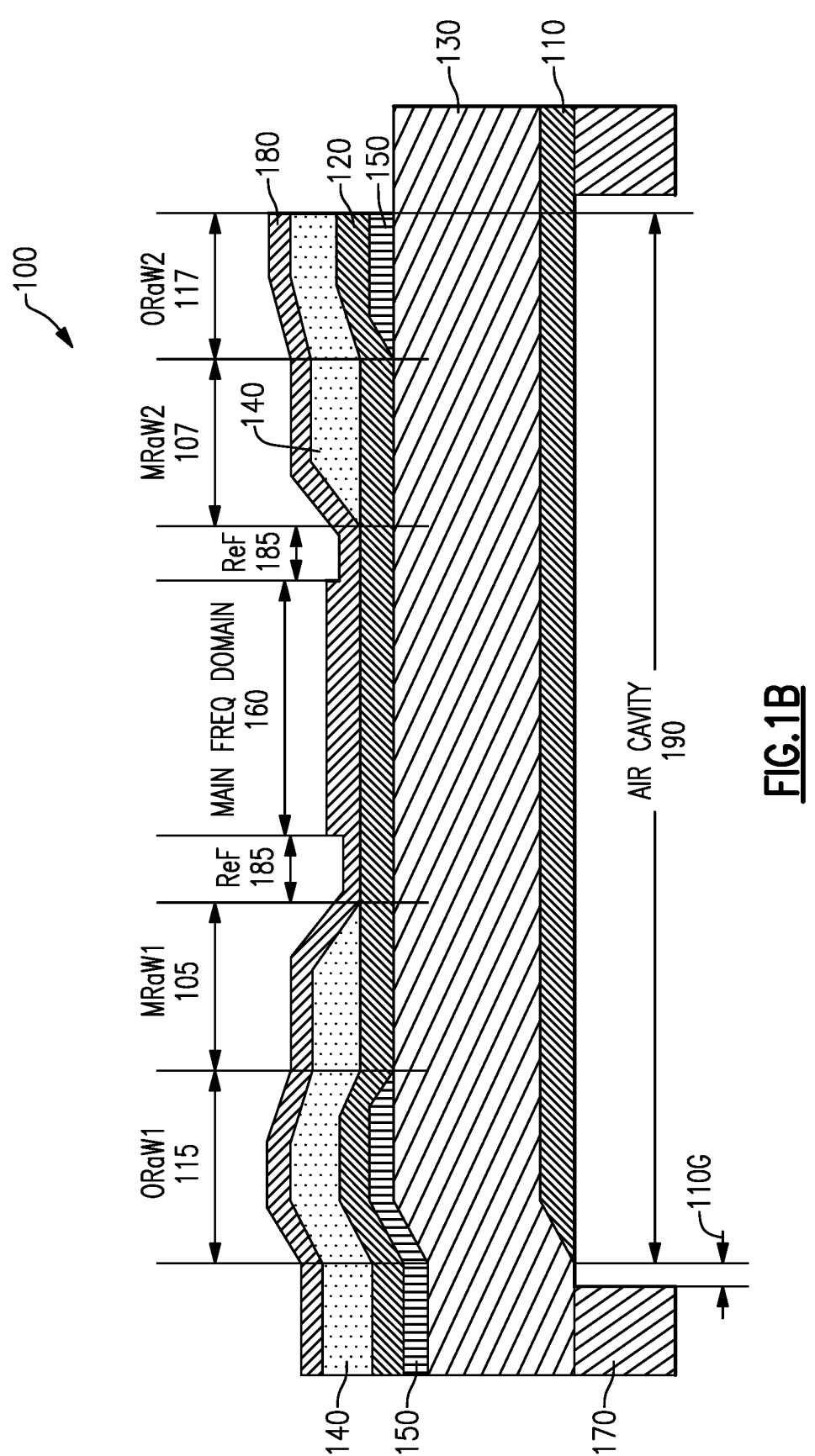

One embodiment of a FBAR device is illustrated in plan view in FIG. 1A and in cross-sectional view in FIG. 1B, indicated generally at 100. The FBAR device 100 can include a first metal layer 120 forming a top electrode, a second metal layer 110 forming a bottom electrode, and a piezoelectric layer 130 between the first metal layer 120 and the second metal layer 110. A resonator can be formed by positioning the piezoelectric layer 130 between the first metal layer 120 and the second metal layer 110. In some embodiments, a portion of the piezoelectric layer 130 that overlaps with the first metal layer 120 and the second metal layer 110 can be referred to as a "resonator." In some embodiments, a metal layer 110, 120 may be referred to as an "electrode." A radio-frequency (RF) signal can be applied to one of the metal layers 110, 120 and can cause an acoustic wave to be generated in the piezoelectric layer 130. The acoustic wave can travel through the piezoelectric layer 130 and can be converted to an RF signal at the other one of the metal layers 110, 120. In this way, the FBAR device 100 can provide filtering functionality. In the FBAR device 100, acoustic waves can travel in a vertical direction (e.g., perpendicular to the metal layers 110, 120 and the piezoelectric layer 130). For example, the vertical direction can be a Z-direction. Some acoustic waves may travel in a horizontal direction (e.g., parallel to the metal layers 110, 120 and the piezoelectric layer 130). For example, the horizontal direction may be a X-direction, Y-direction, or a combination thereof.

The FBAR device 100 can include one or more raised frames ("RaFs"). In the example of FIGS. 1A and 1B, the FBAR device 100 includes a metal raised frame 140 formed of a metal layer and a dielectric or oxide raised frame 150 formed from a dielectric layer which may be, for example, silicon dioxide. The metal raised frame 140 can be on top of the first metal layer 120, and the oxide raised frame 150 can be below the first metal layer 120, between the first metal layer 120 and the piezoelectric layer 130 and between the first metal layer 120 and the second metal layer 110. Each raised frame 140, 150 surrounds a central active region of the FBAR, referred to as a main frequency domain 160 in FIG. 1B.

In different embodiments, a raised frame can be made of or from any suitable material. In some embodiments, a raised frame can be made of or from a similar or the same material as the second metal layer 110 and/or the first metal layer 120. For example, a raised frame can be made of a heavy material. In certain embodiments, a raised frame can be made of or from a low acoustic impedance material. For example, a raised frame can be made of silicon dioxide, silicon nitride, etc. A raised frame may be made of any low density material. In the embodiment of FIGS. 1A and 1B, for example, the metal raised frame 140 may be formed of a metal, and the oxide raised frame 150 may be formed of silicon dioxide. The metal raised frame 140 may formed of a material with a higher acoustic impedance than a material of which the oxide raised frame 150 is formed and a higher acoustic impedance than the material of the piezoelectric layer 130. The oxide raised frame 150 may formed of a material with a lower acoustic impedance than a material of which the metal raised frame 140 is formed and a lower acoustic impedance than the material of the piezoelectric layer 130.

In the example of FIGS. 1A and 1B, the FBAR device 100 is shown to include two raised frames for illustrative purposes, but the number of raised frames included in the FBAR device 100 can vary as appropriate, depending on the embodiment. For example, in some embodiments, the FBAR device 100 can include one raised frame or more than two raised frames. One or more raised frames can be positioned in various configurations. One or more raised frames can be placed at various positions along the vertical direction (e.g., perpendicular to the metal layers 110, 120 and the piezoelectric layer 130). For example, one or more raised frames can be placed at a position above or below the first metal layer 120, above or below the second metal layer 110, between the first metal layer 120 and the second metal layer 110, or any combination thereof. Various examples of configurations of raised frames are described in more detail below.

In some embodiments, the FBAR device 100 can include a passivation layer 180 above the metal raised frame 140 and first metal layer 120. The passivation layer 180 can be on top of the metal raised frame 140 and an exposed portion of the first metal layer 120. The exposed portion of the first metal layer 120 can be a portion that is not covered by the metal raised frame 140. In certain embodiments, the FBAR device 100 may also include recessed frame (ReF) regions 185 that may be defined by thinned portions of the passivation layer 180 and that define outer boundaries of the main frequency domain 160. The passivation layer 180 may be thinner in the recessed frame regions 185 than in the main frequency domain 160. The thickness of the passivation payer 180 in the recessed frame regions 185 can be similar to or the same as the thickness of the passivation layer 180 over the metal raised frame 140. In some embodiments, the recessed frame region 185 can be a contiguous ring structure surrounding the main frequency domain 160. The passivation layer 180 may be formed of a dielectric material, for example, silicon dioxide or silicon nitride. In some embodiments, the FBAR device 100 can include a support substrate 170 formed of, for example, silicon, and an air cavity 190 below the second metal layer 110. In some embodiments, a distal end of the second metal layer 110 may be separated from the adjacent region of the substrate 170 by a gap 110G.

As indicated in FIG. 1A, the FBAR may have a polygonal perimeter, for example, quadrilateral, although in other embodiments, an FBAR may have a differently shaped perimeter with more or fewer than four sides or with curved sides or an oval perimeter. Each of the raised frames 140, 150 may have widths that are constant or substantially constant about the perimeter of the FBAR. In FIGS. 1A and 1B as well as other figures presented herein, the term MRaW refers to the width of the metal raised frame 140. The term MRaW1 refers to the width of the metal raised frame on one side of the FBAR structure and the term MRaW2 refers to the width of the metal raised frame 140 on an opposite side of the FBAR structure. The width of the metal raised frame 140 is defined as the distance between an inner edge or tip of the metal raised frame 140 on the side of the metal raised frame closest to the main frequency domain 160 and the inner edge of the oxide raised frame 150 on the side of the oxide raised frame closest to the main frequency domain 160. The meanings of the terms MRaW1 and MRaW2 are illustrated in FIG. 1B and are provided with indicator numbers 105 and 107, respectively. In the example of FIGS. 1A and 1B MRaW1 and MRaW2 are substantially the same or the same.

In FIGS. 1A and 1B as well as other figures presented herein, the term ORaW refers to the width of the oxide raised frame 150. The term ORaW1 refers to the width of the oxide raised frame 150 on one side of the FBAR structure and the term ORaW2 refers to the width of the oxide raised frame 150 on an opposite side of the FBAR structure. The width of the oxide raised frame 150 is defined as the distance between an inner edge or tip of the oxide raised frame 150 on the side of the oxide raised frame 150 closest to the main frequency domain 160 and a point in the oxide film disposed above an end of the second metal layer 110 in a direction normal to a plane defined by the second metal layer 110. It is to be understood that the term "above" is used to refer to a direction in the presented figures, and the FBAR structure may be differently oriented, for example, inverted from the orientation illustrated without altering the relative direction referenced by this term. The meanings of the terms ORaW1 and ORaW2 are illustrated in FIG. 1B and are provided with indicator numbers 115 and 117, respectively. In the example of FIGS. 1A and 1B ORaW1 and ORaW2 are substantially the same or the same.

As can be observed in FIGS. 1A and 1B, the metal top electrode interconnection 122 and the metal bottom electrode interconnection 112 are asymmetric. The first metal layer 120 and the second metal layer 110 forming the electrodes of the FBAR are also asymmetric. Given these asymmetries, raised frames having constant widths about the entire perimeter of the FBAR may not be optimal. In some embodiments, properties such as quality factor or electromagnetic coupling factor of the FBAR may be improved by forming the metal raised frame 140, oxide raised frame 150, or both, with different widths on different sides of the FBAR.

Figure 2A:
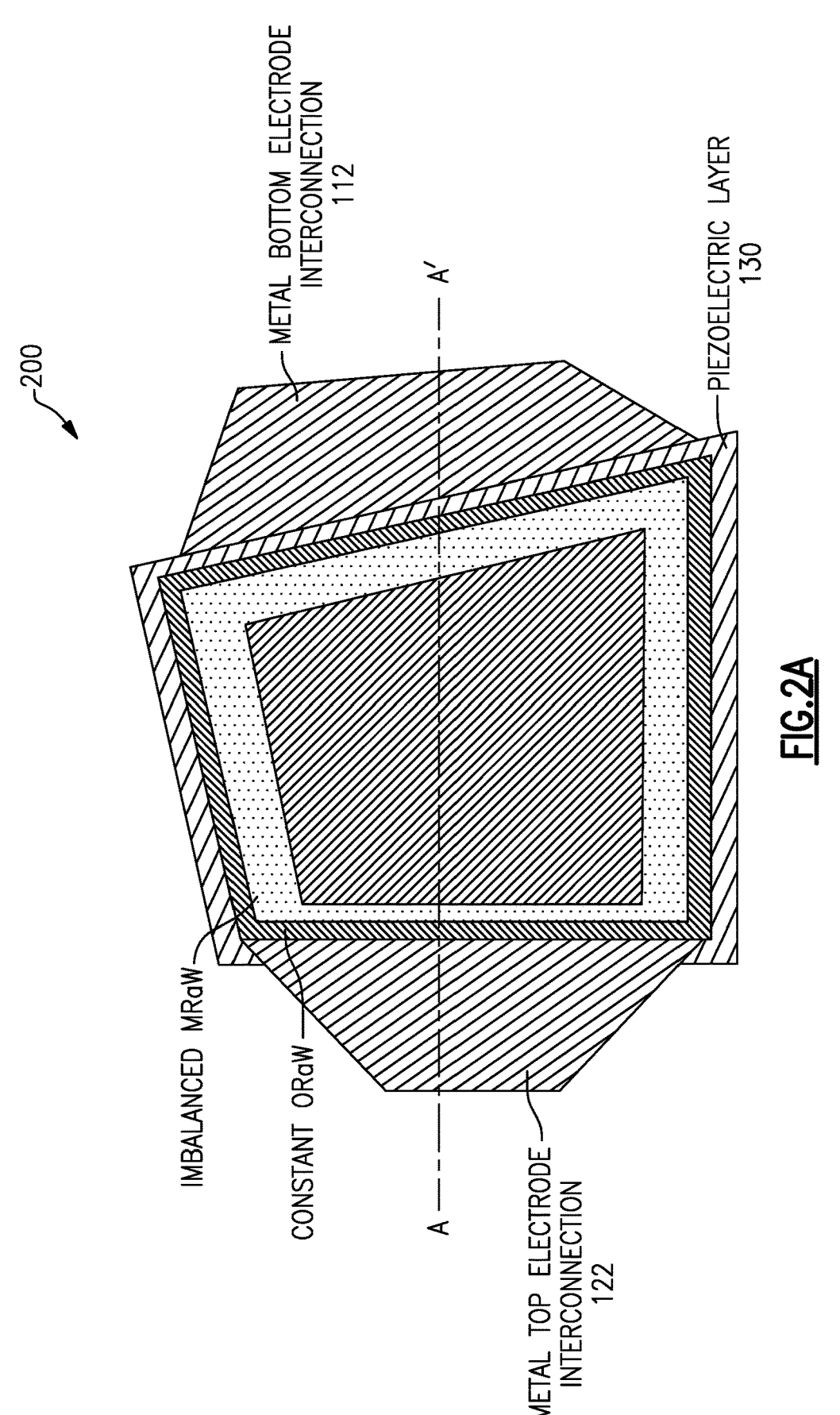
FIG. 2A is a plan view of another example of a FBAR.
Figure 2B:
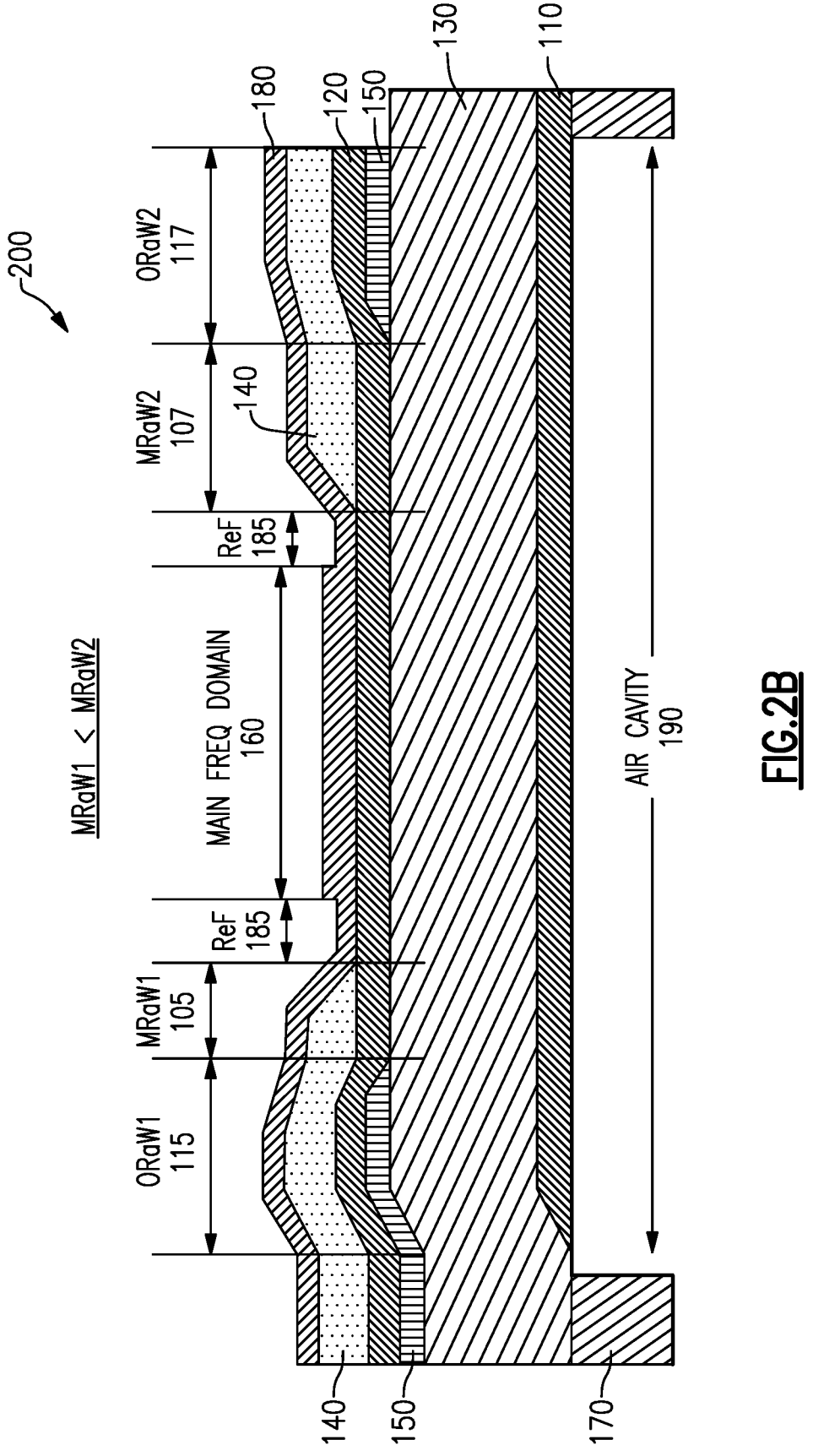
FIG. 2B is a cross-sectional view of the example FBAR of FIG. 2A along line A-A'.
Figure 2C:
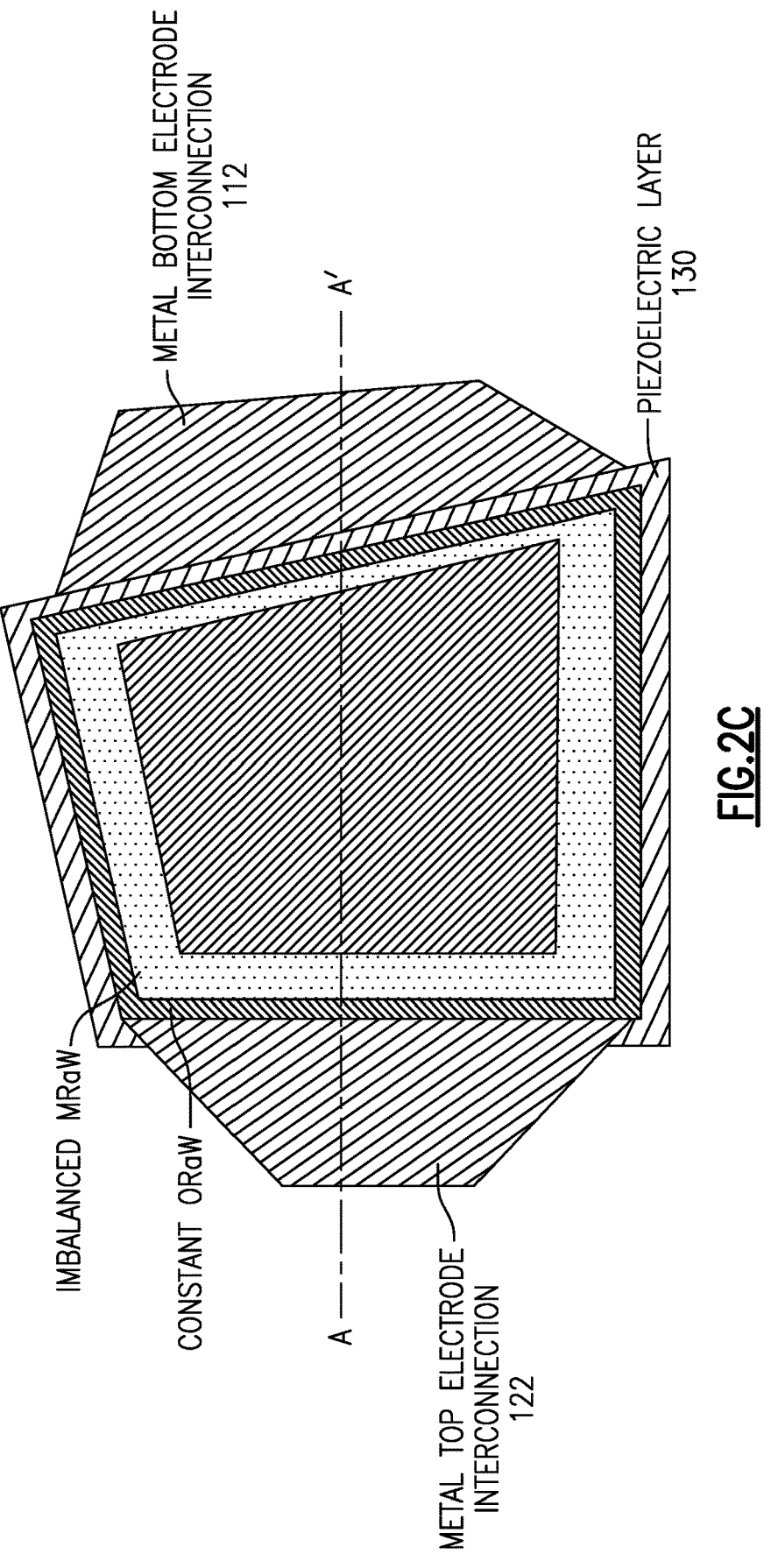
FIG. 2C is a plan view of another example of a FBAR.
Figure 2D:
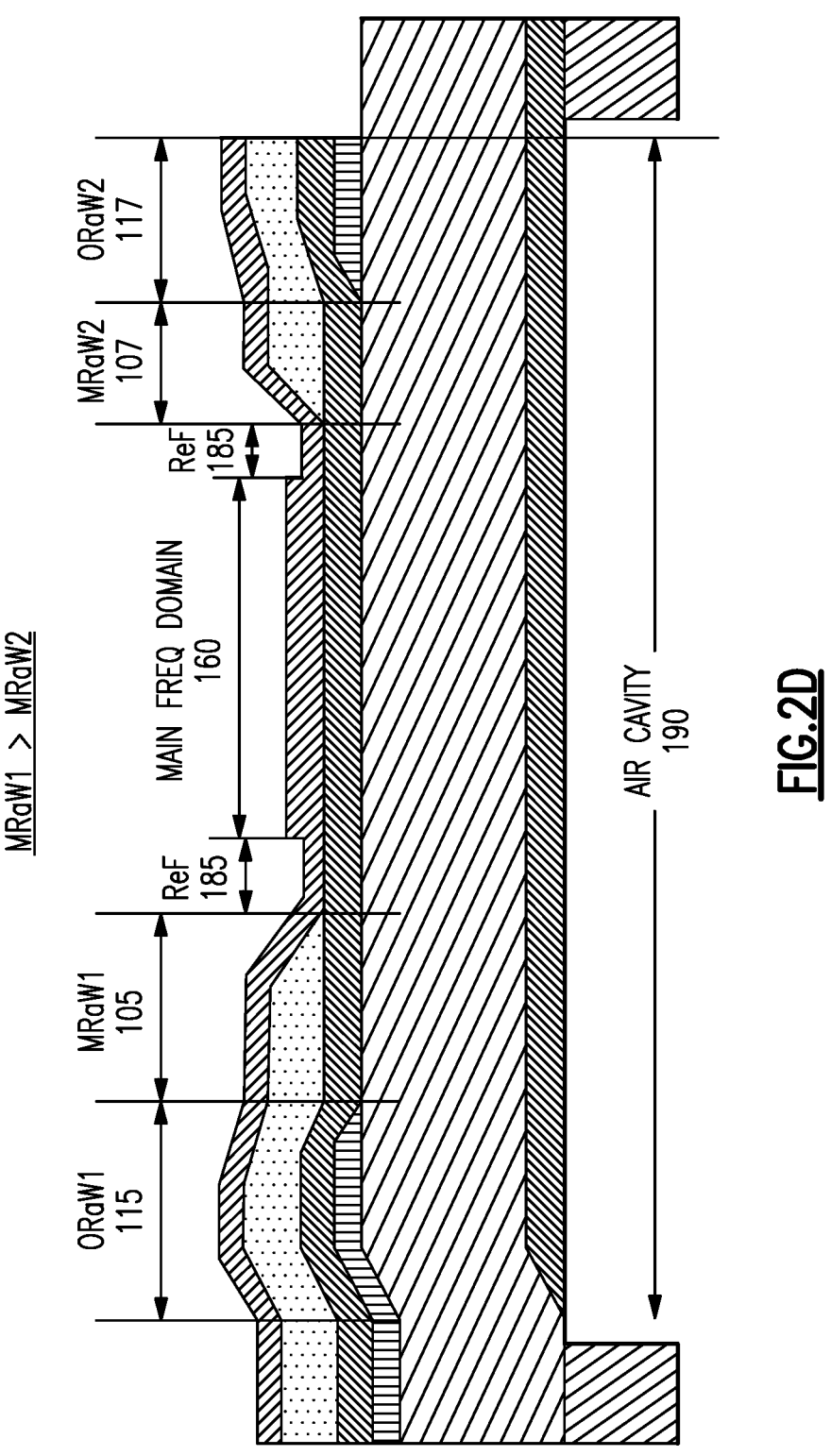
FIG. 2D is a cross-sectional view of the example FBAR of FIG. 2C along line A-A'.

FIGS. 2A and 2B illustrate an example of an FBAR structure 200 in plan and cross-sectional views, respectively, in which the metal raised frame 140 is imbalanced, having a width MRaW1 105 on the side of the FBAR on which the metal top electrode interconnection 122 is formed that is less than a width MRaW2 107 of the metal raised frame 140 on the side of the FBAR 200 on which the metal bottom electrode interconnection 112 is formed. The metal raised frame width MRaW1 105 may be less than the oxide raised frame width ORaW1 115. The metal raised frame 140 has the same or substantially the same width on sides of the FBAR 200 other than the side of the FBAR on which metal top electrode interconnection 122 is formed. The oxide raised frame 150 may be balanced, having the same or substantially the same width on all sides of the FBAR 200. In an alternative embodiment, illustrated in FIGS. 2C and 2D, the FBAR structure 200 of FIGS. 2A and 2B may be modified such that the width of the metal raised frame MRaW1 105 on the side of the FBAR on which the metal top electrode interconnection 122 is formed is greater than the width MRaW2 107 of the metal raised frame 140 on the side of the FBAR 200 on which the metal bottom electrode interconnection 112 is formed.

Figure 3A:
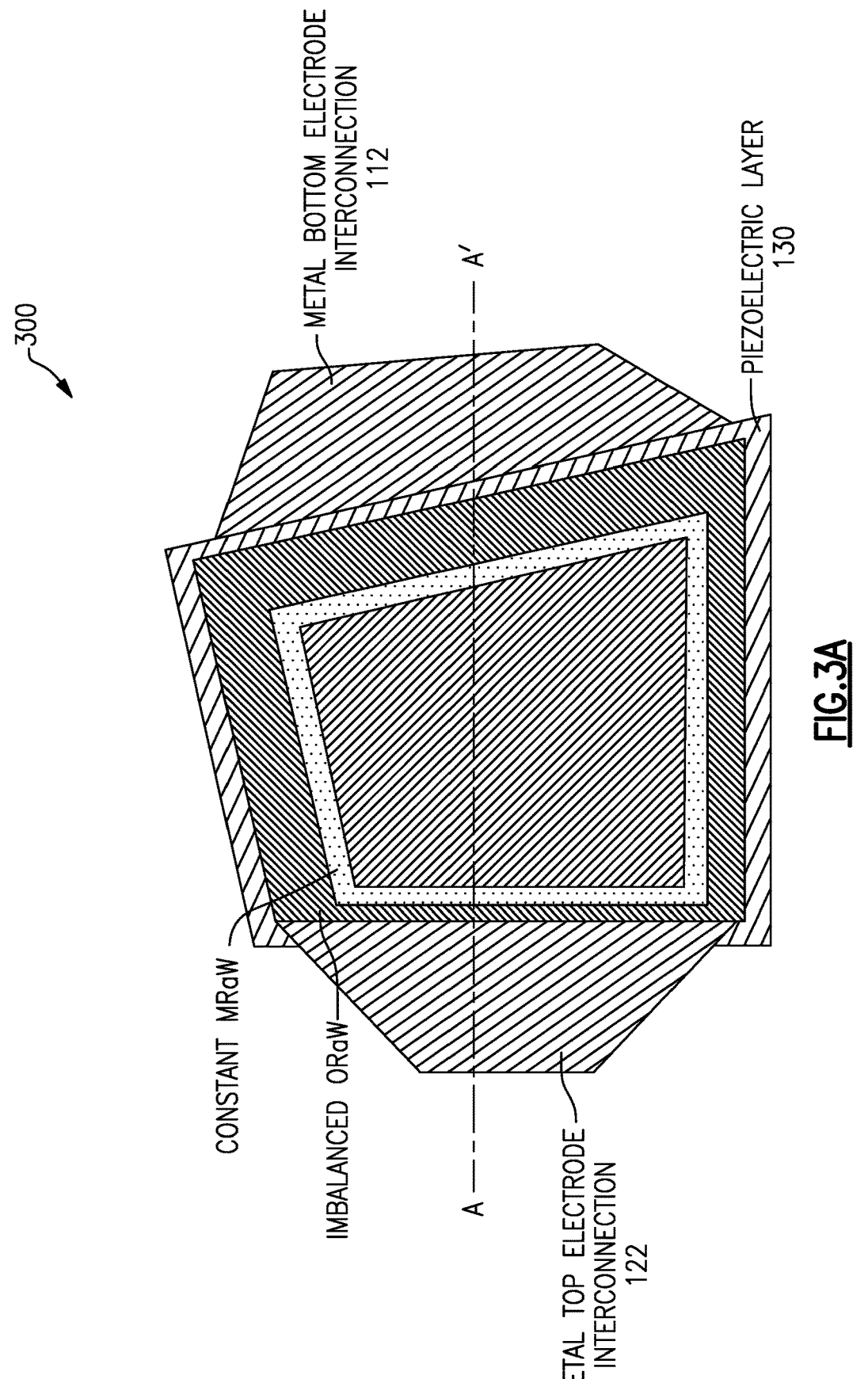
FIG. 3A is a plan view of another example of a FBAR.
Figure 3B:
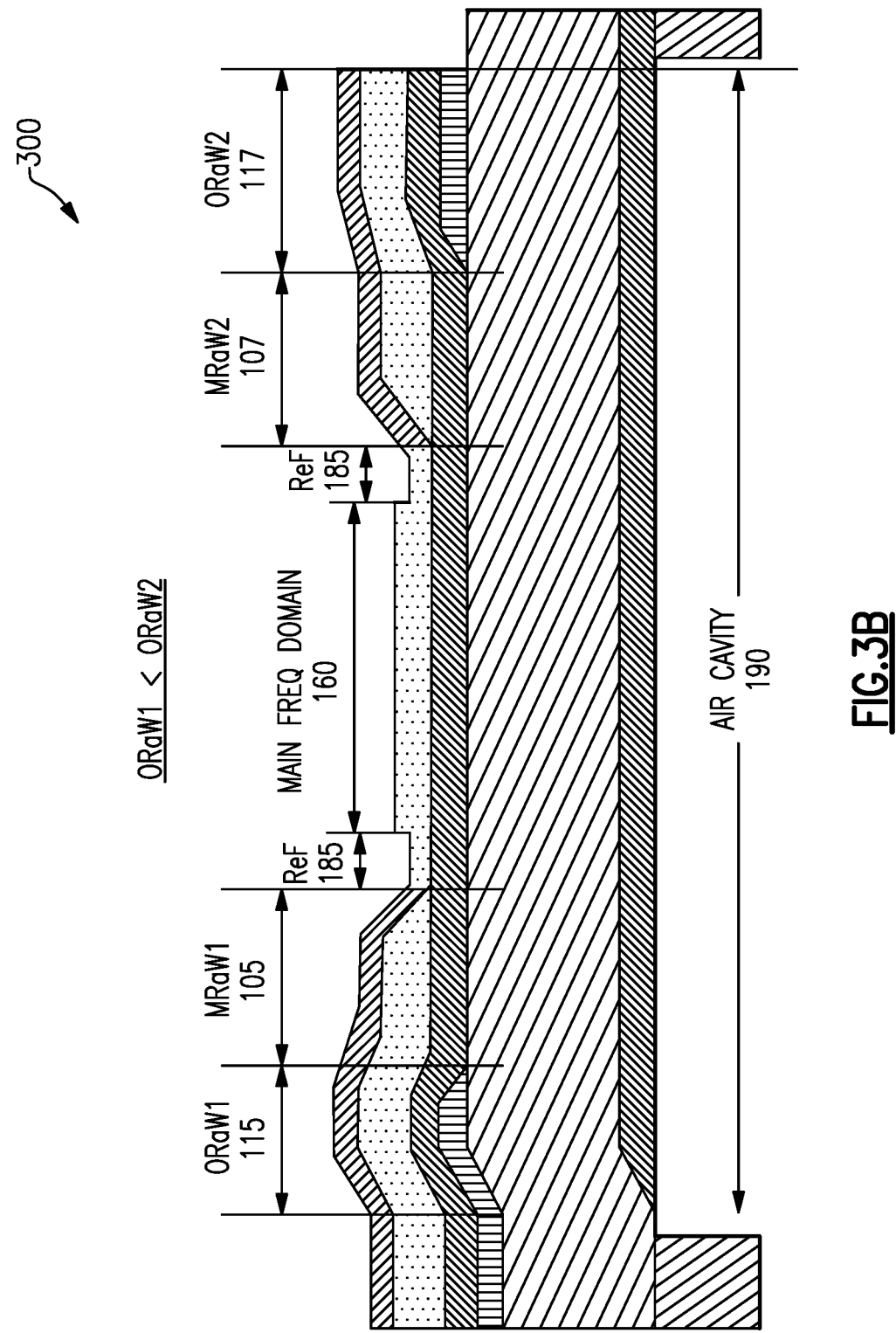
FIG. 3B is a cross-sectional view of the example FBAR of FIG. 3A along line A-A'.
Figure 3C:
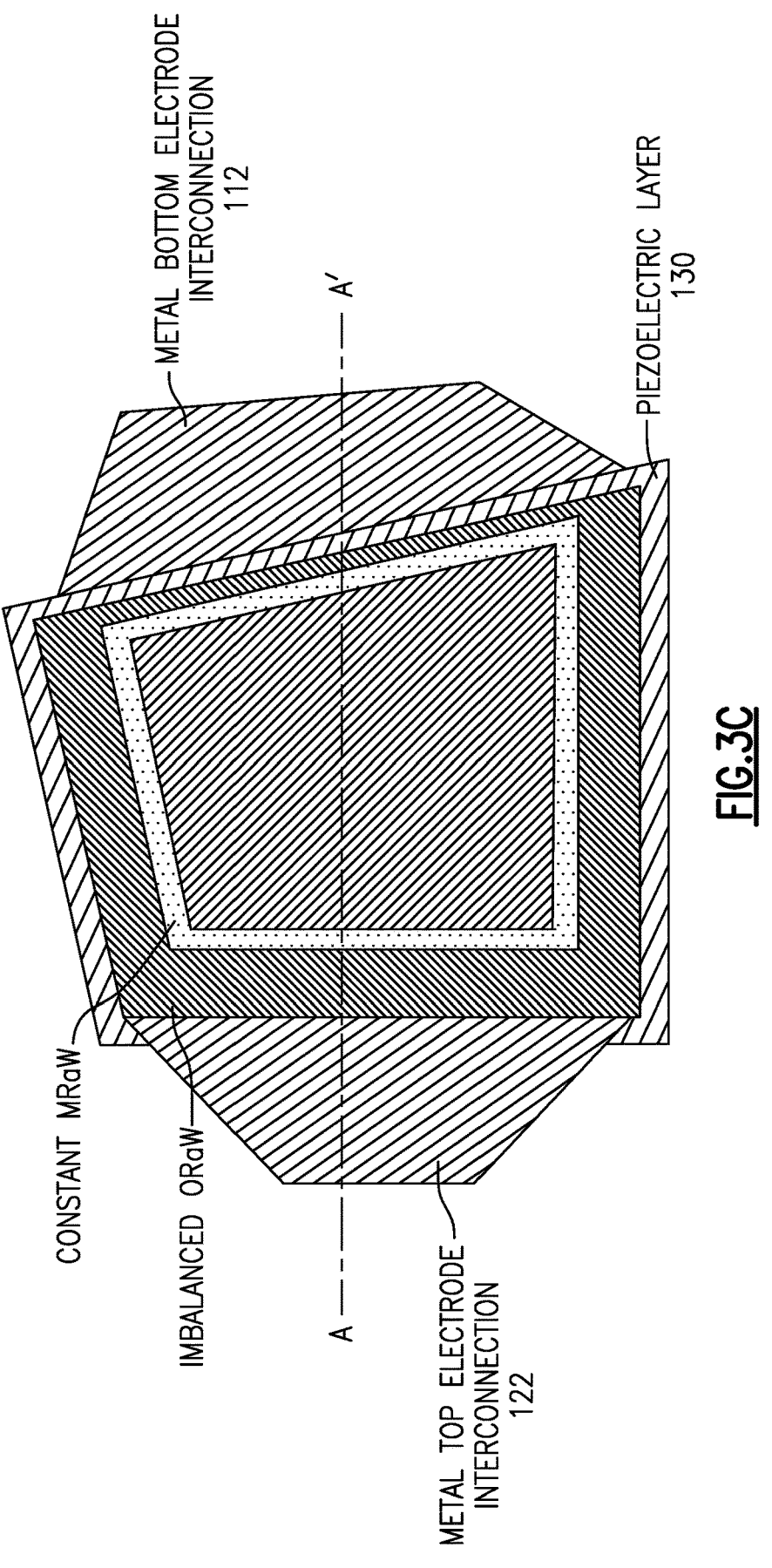
FIG. 3C is a plan view of another example of a FBAR.
Figure 3D:
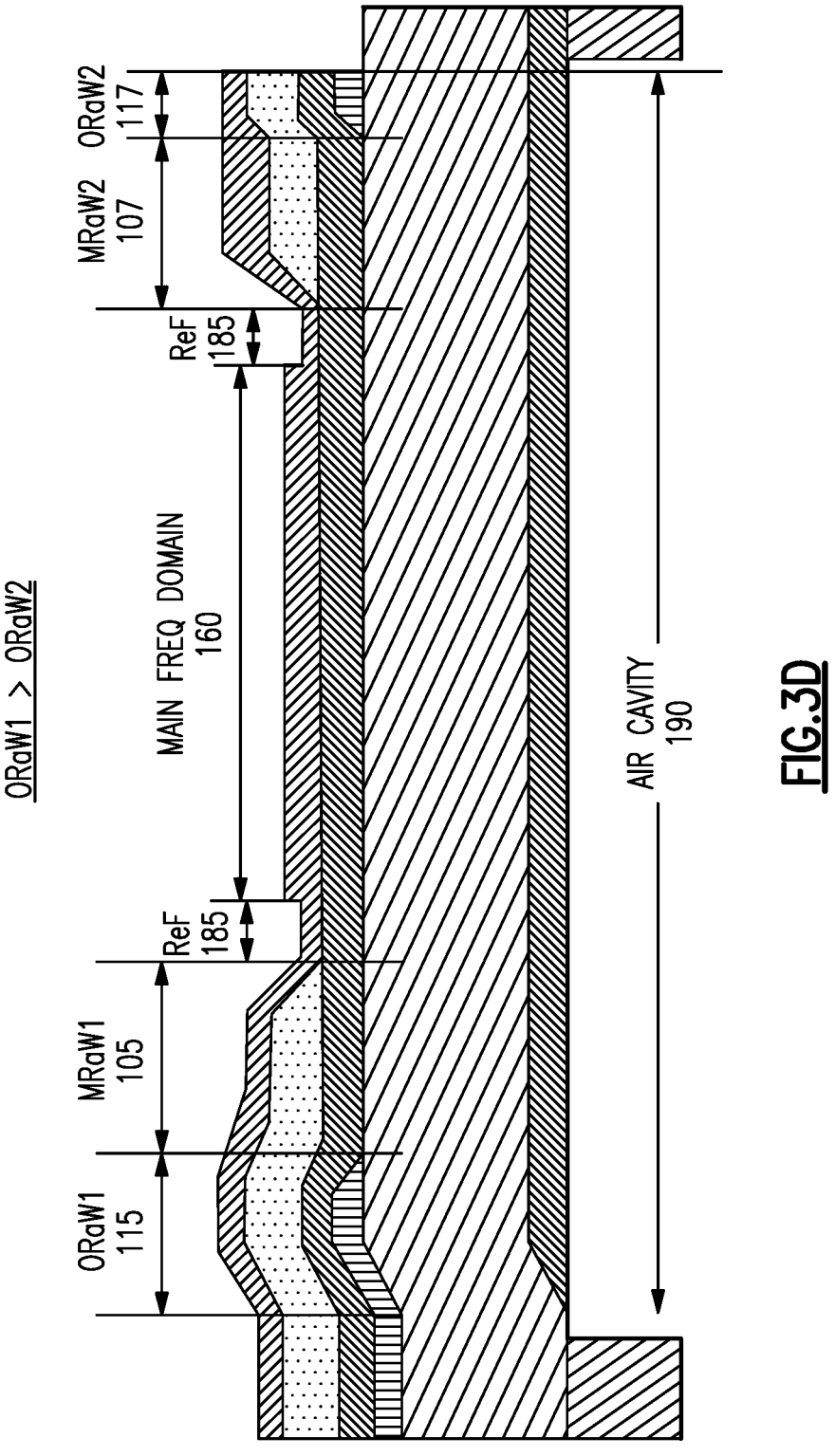
FIG. 3D is a cross-sectional view of the example FBAR of FIG. 3C along line A-A'.

FIGS. 3A and 3B illustrate an example of an FBAR structure 300 in plan and cross-sectional views, respectively, in which the oxide raised frame 150 is imbalanced, having a width ORaW1 115 on the side of the FBAR on which the metal top electrode interconnection 122 is formed that is less than a width ORaW2 117 of the oxide raised frame 150 on the side of the FBAR 200 on which the metal bottom electrode interconnection 112 is formed. The oxide raised frame width ORaW1 115 may be less than the metal raised frame width MRaW1 105 and the metal raised frame width MRaW2 107. The oxide raised frame 150 has the same or substantially the same width on sides of the FBAR 200 other than the side of the FBAR on which the metal top electrode interconnection 122 is formed. The metal raised frame 140 may be balanced, having the same or substantially the same width on all sides of the FBAR 200. In an alternative embodiment, illustrated in FIGS. 3C and 3D, the FBAR structure 300 of FIGS. 3A and 3B may be modified such that the width of the oxide raised frame ORaW1 115 on the side of the FBAR on which the metal top electrode interconnection 122 is formed that is less than the width ORaW2 117 of the oxide raised frame 150 on the side of the FBAR 200 on which the metal bottom electrode interconnection 112 is formed.

Figure 4A:
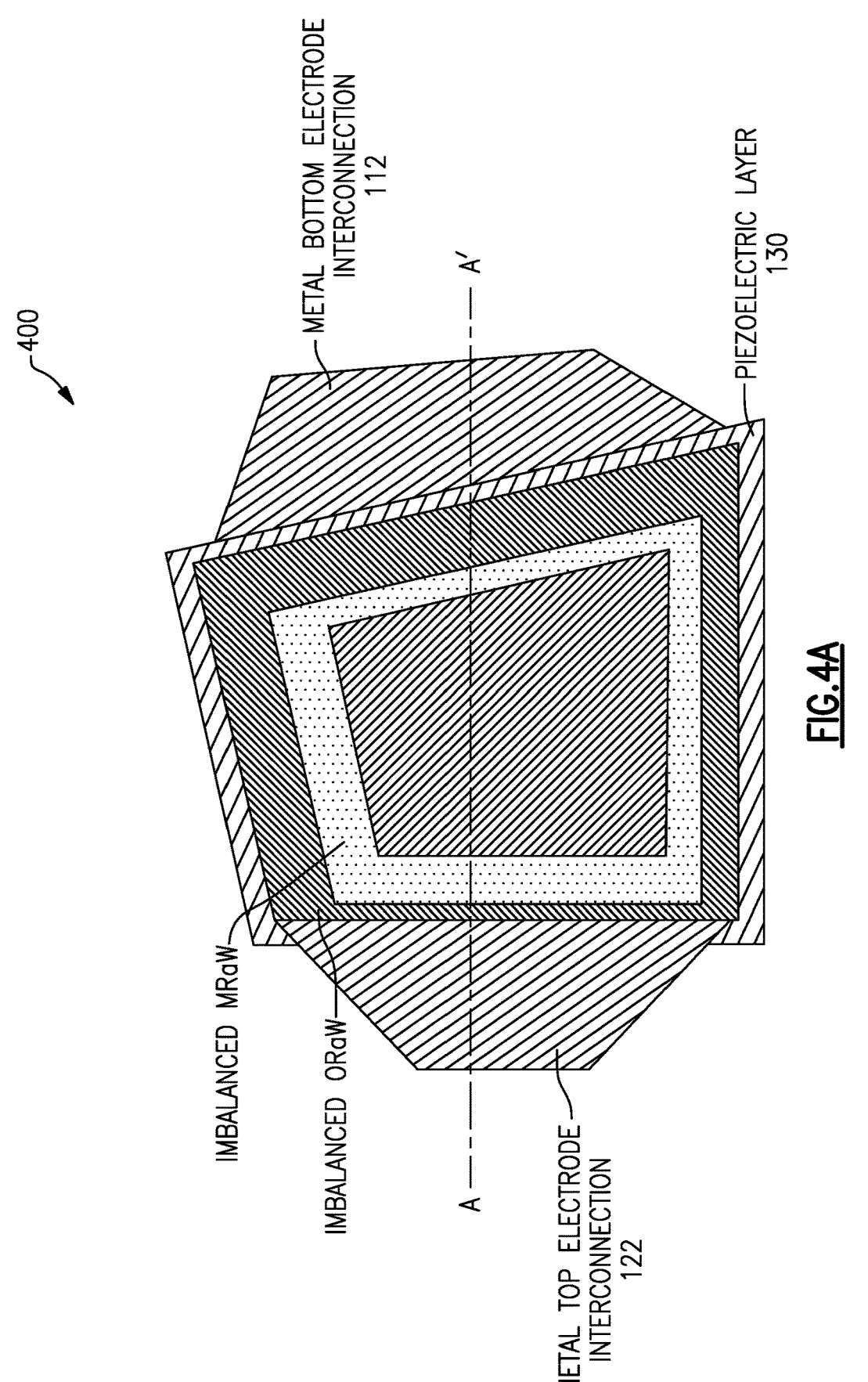
FIG. 4A is a plan view of another example of a FBAR.
Figure 4B:
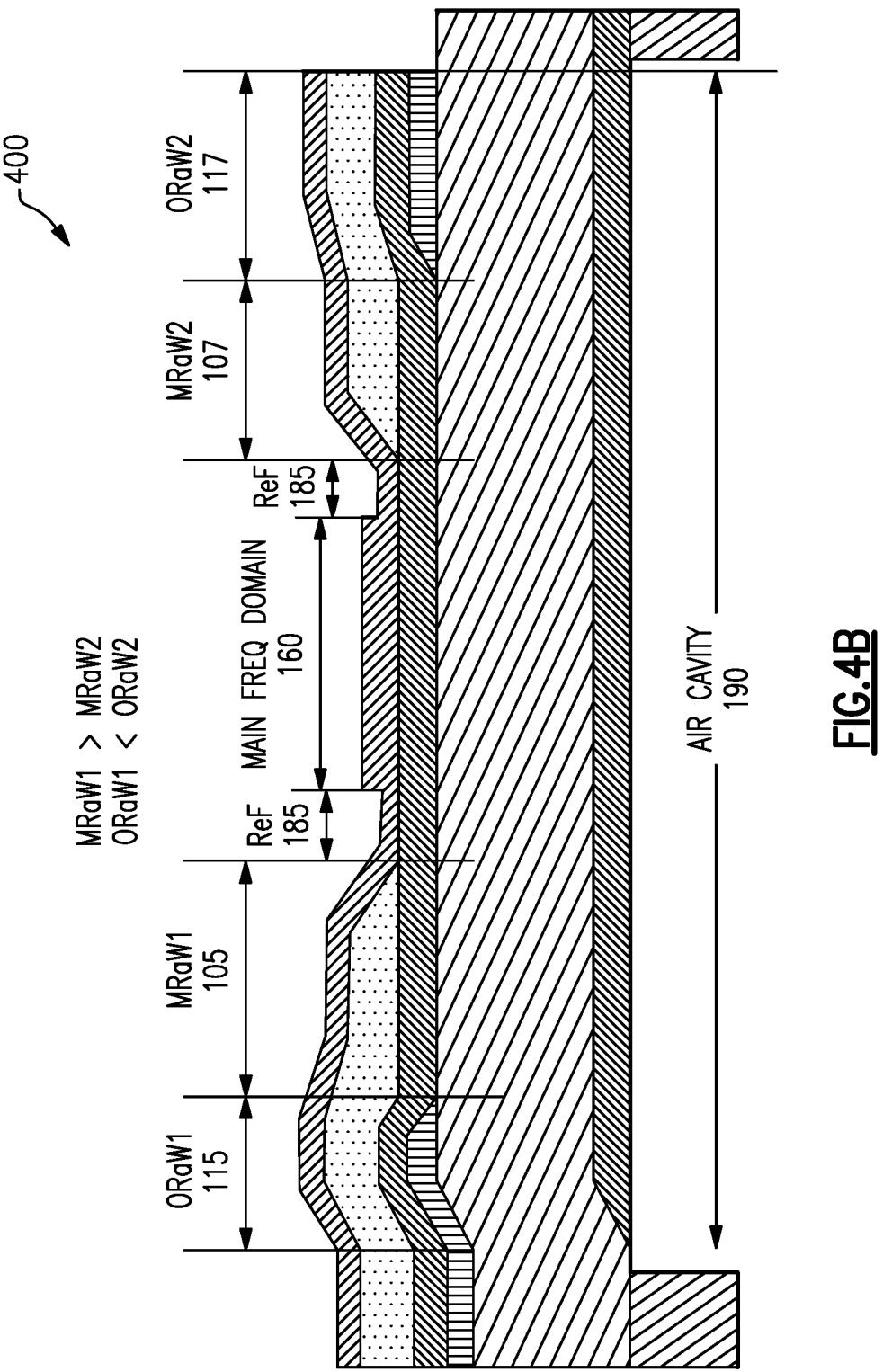
FIG. 4B is a cross-sectional view of the example FBAR of FIG. 4A along line A-A'.

FIGS. 4A and 4B illustrate an example of an FBAR structure 400 in plan and cross-sectional views, respectively, in which both the metal raised frame 140 and the oxide raised frame 150 are imbalanced. The metal raised frame 140 has a width MRaW1 105 on the side of the FBAR on which the metal top electrode interconnection 122 is formed that is greater than a width MRaW2 107 of the metal raised frame 140 on the side of the FBAR 200 on which the metal bottom electrode interconnection 112 is formed. The oxide raised frame 150 has a width ORaW1 115 on the side of the FBAR on which the metal top electrode interconnection 122 is formed that is less than a width ORaW2 117 of the oxide raised frame 150 on the side of the FBAR 200 on which the metal bottom electrode interconnection 112 is formed. The oxide raised frame width ORaW1 115 may be less than the metal raised frame width MRaW1 105. The oxide raised frame width ORaW2 117 may be greater than the metal raised frame width MRaW2 107. The oxide raised frame 150 has the same or substantially the same width on sides of the FBAR 200 other than the side of the FBAR on which the metal top electrode interconnection 122 is formed. The metal raised frame 140 has the same or substantially the same width on sides of the FBAR 200 other than the side of the FBAR on which the metal bottom electrode interconnection 112 is formed. In an alternative embodiment, illustrated in FIGS. 4C and 4D, the FBAR structure 400 of FIGS. 4A and 4B may be modified such that the portions of the metal raised frame and the oxide raised frame with the lesser widths are on the same side of the FBAR or such that the portion of the metal raised frame with the lesser width is on the side of the FBAR on which the metal top electrode interconnection 122 is formed and the portion of the oxide raised frame with the lesser width is on the side of the FBAR on which the metal bottom electrode interconnection 122 is formed.

Figure 5:
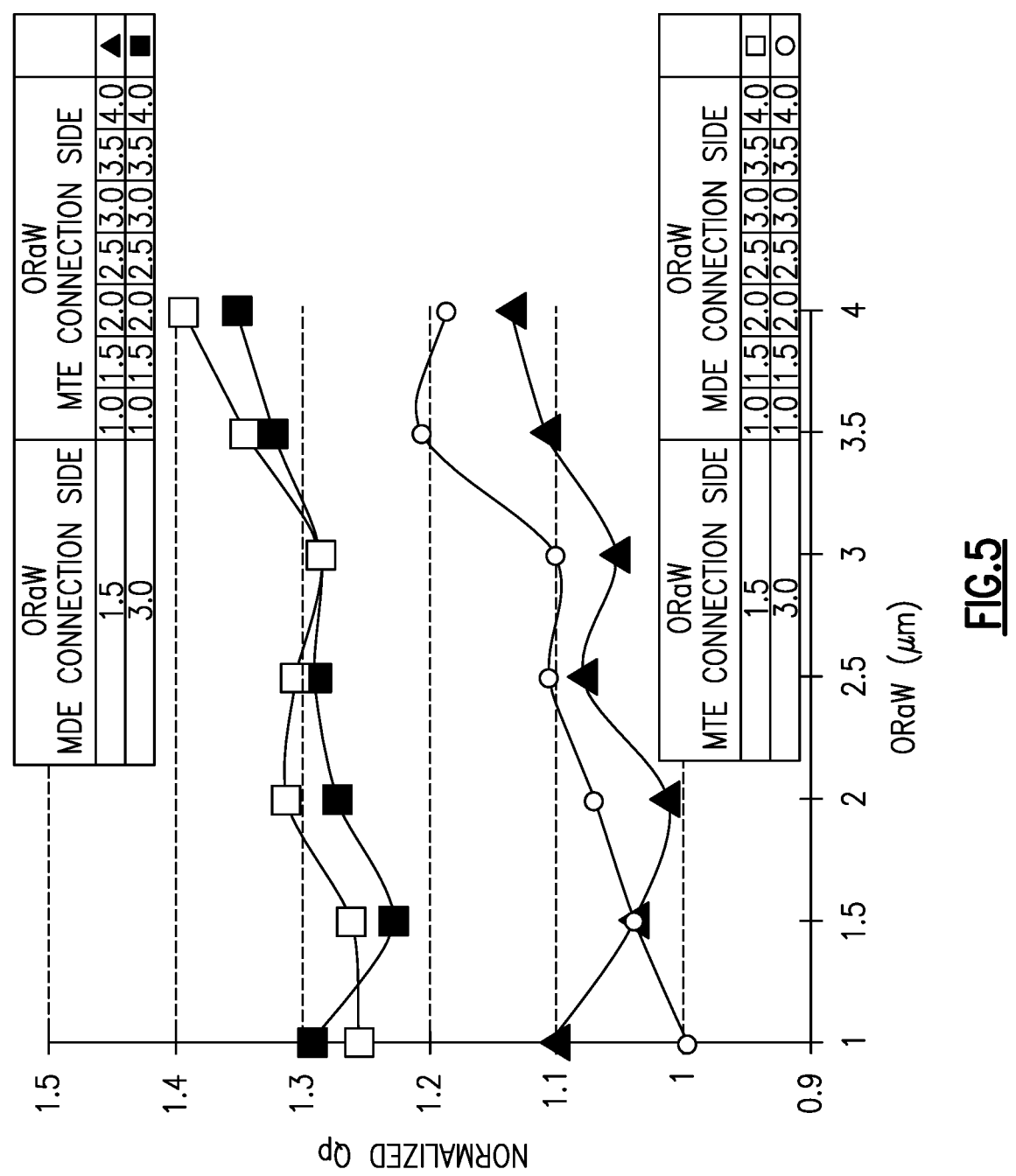
FIG. 5 illustrates results of a simulation of the effect of oxide raised frame width on quality factor at the anti-resonance frequency for an example of a FBAR.

FIG. 5A illustrates results of a simulation of the effect of oxide raised frame width on quality factor Q at the anti-resonance frequency for an example of a FBAR as disclosed herein. As can be seen, the quality factor Q generally increases with increasing oxide raised frame width on both the side of the FBAR including the metal bottom electrode interconnection (MBE connection side) and the side of the FBAR including the metal top electrode interconnection (MTE connection side).

FIG. 5B illustrates results of a simulation of the effect of oxide raised frame width on coupling factor k2 for an example of a FBAR as disclosed herein. As can be seen, the coupling factor generally decreases with increasing oxide raised frame width on both the side of the FBAR including the metal bottom electrode interconnection (MBE connection side) and the side of the FBAR including the metal top electrode interconnection (MTE connection side).

Figure 6:
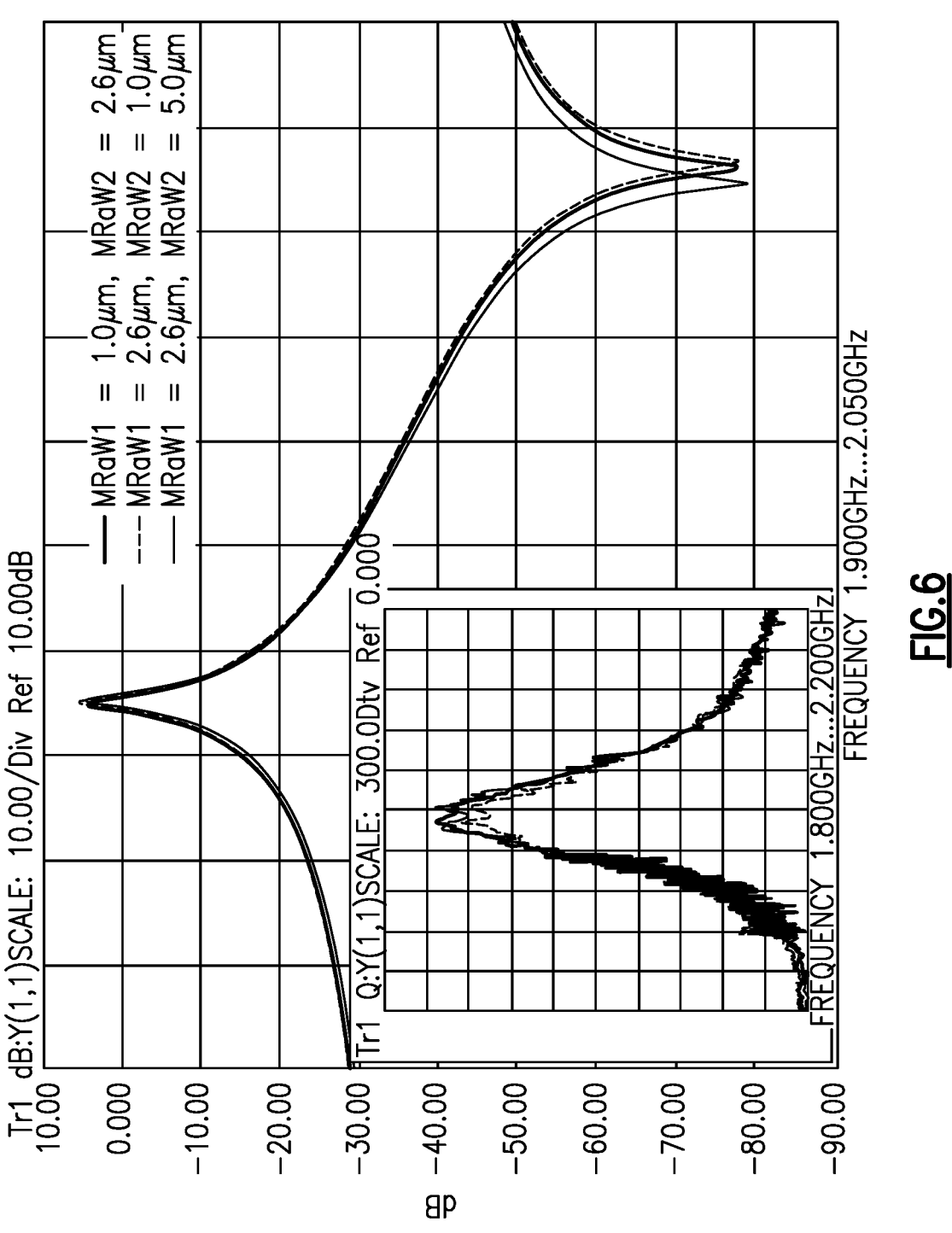
FIG. 6 is a chart illustrating results of a simulation of the effect of changes in metal raised frame width on admittance and quality factor Q of an example of an FBAR as disclosed herein.

FIG. 6 is a chart illustrating results of a simulation of the effect of changes in metal raised frame width on admittance and quality factor Q of an example of an FBAR as disclosed herein. As can be observed, an increasing metal raised frame width changes the electromagnetic coupling coefficient $k^2$ while keeping the quality factor the same, which provides for the possibility of tuning the coupling coefficient $k^2$ without affecting the quality factor Q.

Figure 7:
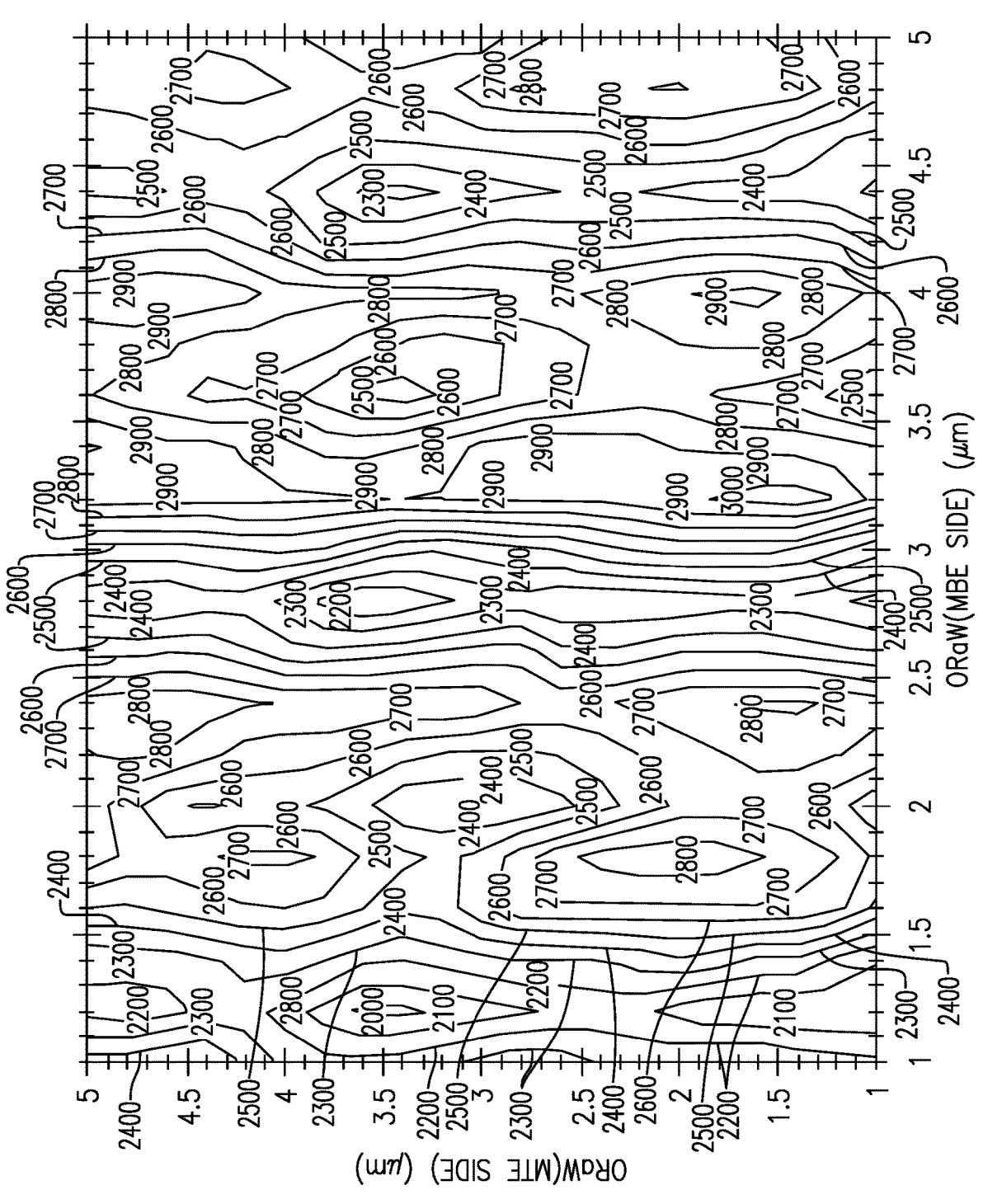
FIG. 7 is a chart illustrating results of a simulation of the effect of changes in oxide raised frame width on quality factor Q at the anti-resonance frequency of an example of an FBAR as disclosed herein.

FIG. 7 is a chart illustrating results of a simulation of the effect of changes in oxide raised frame width on quality factor Q at the anti-resonance frequency of an example of an FBAR as disclosed herein. The side of the FBAR including the metal bottom electrode interconnection is indicated as the MBE side and the side of the FBAR including the metal top electrode interconnection is indicated as the MTE side. As can be seen from this figure, there is periodicity in increases and decreases in quality factor with changes in oxide raised frame width on both the side of the FBAR including the metal bottom electrode interconnection and the side of the FBAR including the metal top electrode interconnection. The results in this chart are consistent with those in the chart of FIG. 5 which shows a general increase in quality factor with increasing oxide raised frame widths, but with periodic dips in quality factor as the oxide frame widths are increased.

Figure 8:
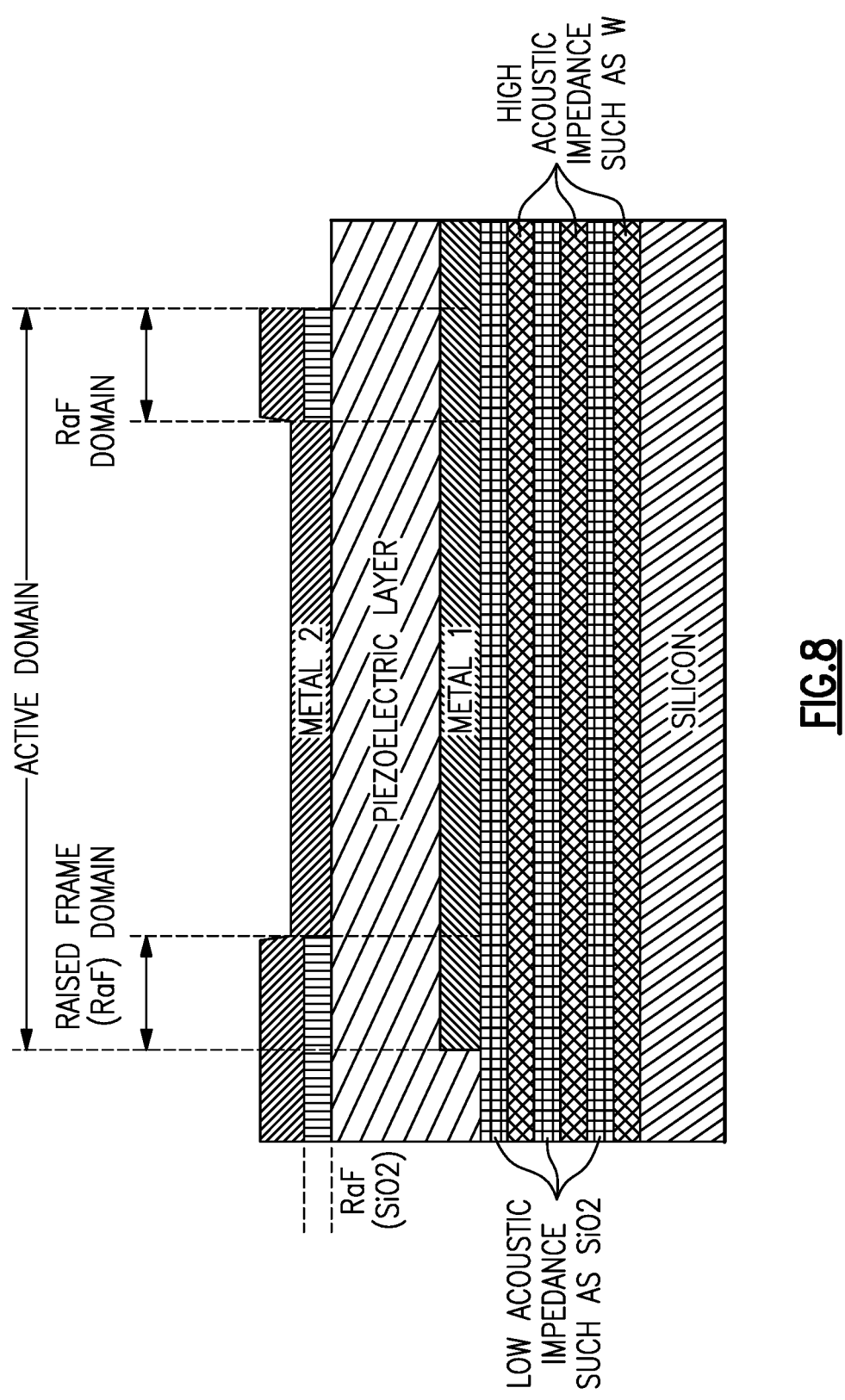
FIG. 8 is a cross-sectional view of an example of a solidly mounted resonator (SMR)

Aspects and embodiments of raised frame structures as disclosed herein may be utilized with not only FBAR devices as discussed above, but also with other forms of bulk acoustic wave resonators, for example, solidly mounted resonators (SMRs). As illustrated in FIG. 8, an example of an SMR may include a piezoelectric layer formed of, for example, aluminum nitride or another suitable piezoelectric material, an upper electrode (the metal 2 layer in FIG. 8) disposed on an upper surface of the piezoelectric layer, and a lower electrode (the metal 1 layer in FIG. 8) disposed on lower surface of the piezoelectric layer. The piezoelectric layer and upper and lower electrodes may be disposed on a Bragg reflector formed of alternating layers of a first material with a high acoustic impedance, for example, tungsten, and a second material with a lower acoustic impedance than the first material, for example, $SiO_2$. The Bragg reflector may be mounted on a substrate, for example, a silicon substrate. The SMR may have a raised frame including a layer of a dielectric material, for example, $SiO_2$ (the raised frame layer illustrated in FIG. 8) disposed between the lower surface of the upper electrode and the piezoelectric material in a raised frame domain region of the resonator.

Figure 4C:
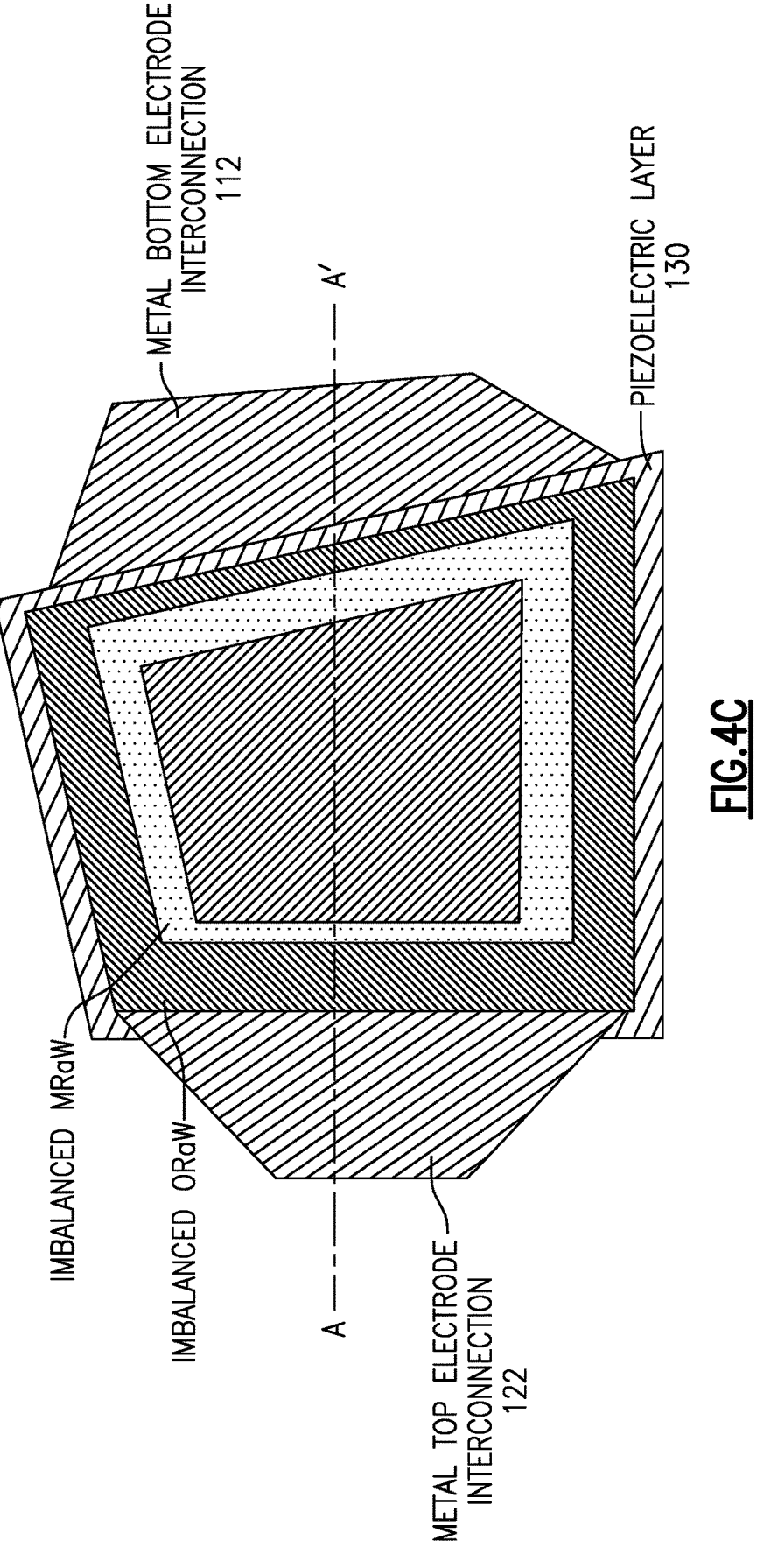
FIG. 4C is a plan view of another example of a FBAR.
Figure 4D:
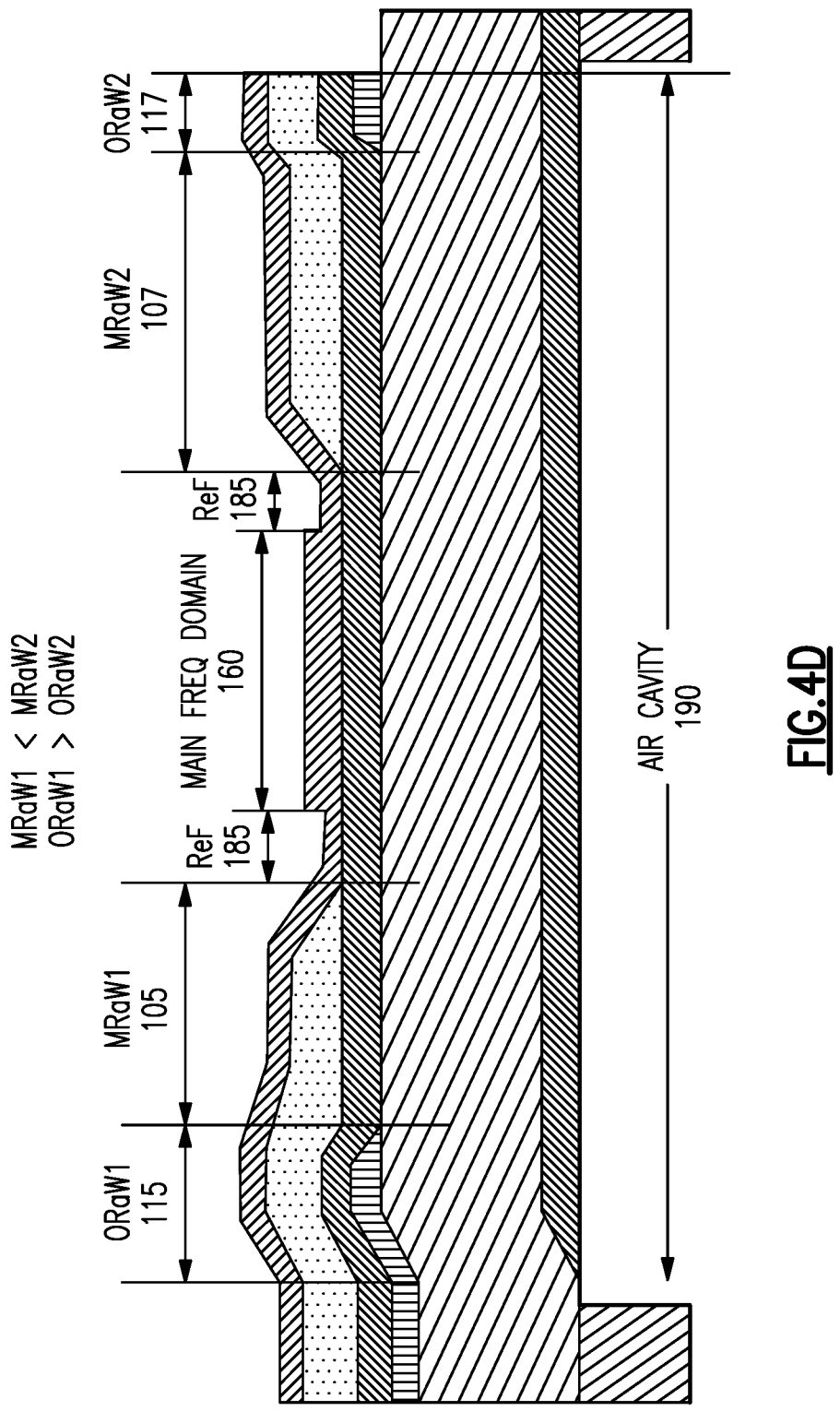
FIG. 4D is a cross-sectional view of the example FBAR of FIG. 4C along line A-A'.
Figure 9A:
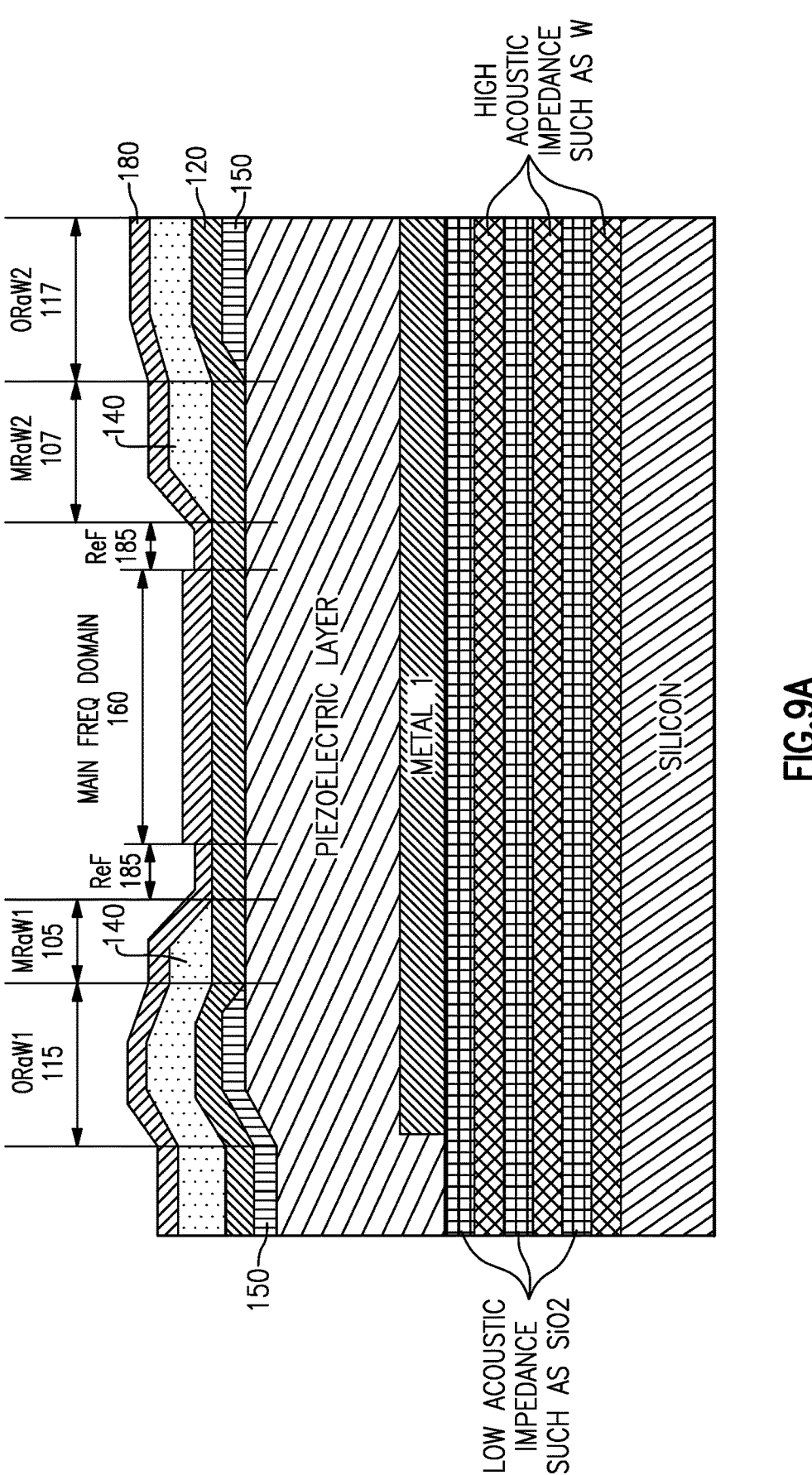
FIG. 9A is a cross-sectional view of an example of a SMR including an example of a raised frame structure as disclosed herein.
Figure 9B:
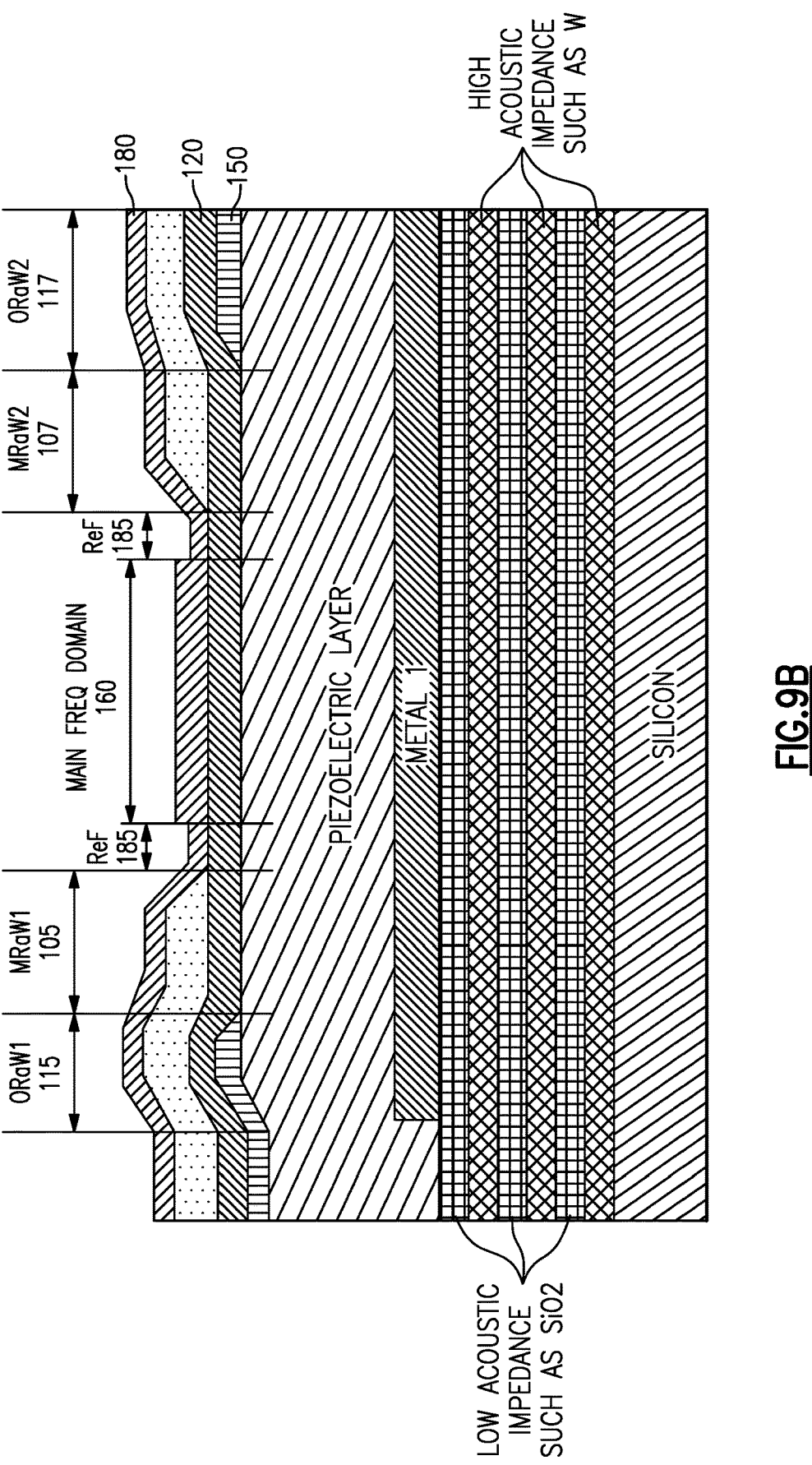
FIG. 9B is a cross-sectional view of another example of a SMR including an example of a raised frame structure as disclosed herein.
Figure 9C:
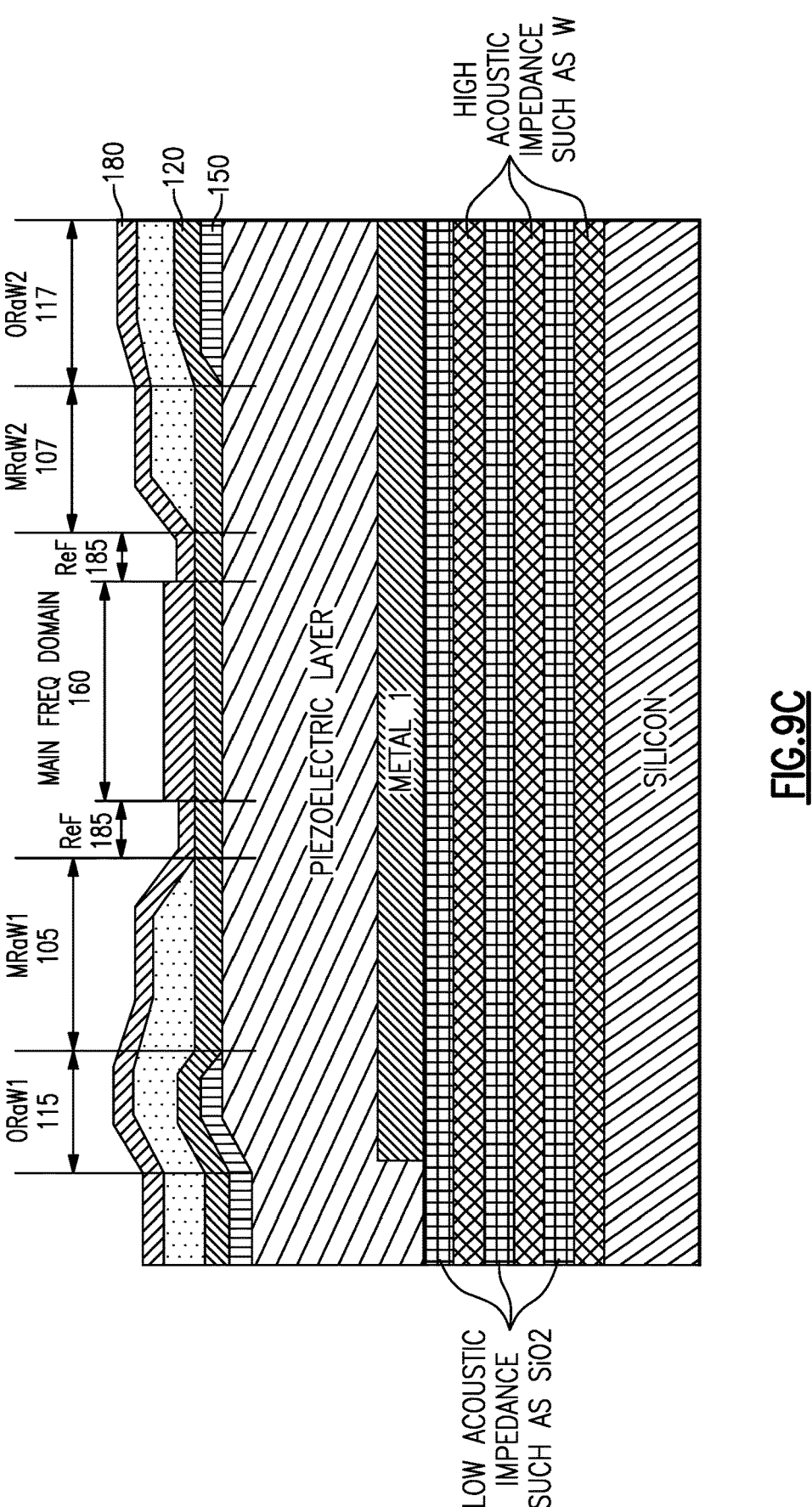
FIG. 9C is a cross-sectional view of another example of a SMR including an example of a raised frame structure as disclosed herein.

FIG. 9A illustrates how a raised frame structure as illustrated in the FBAR of FIGS. 2A and 2B may be utilized in a SMR. FIG. 9B illustrates how a raised frame structure as illustrated in the FBAR of FIGS. 3A and 3B may be utilized in a SMR. FIG. 9C illustrates how a raised frame structure as illustrated in the FBAR of FIGS. 4A and 4C may be utilized in a SMR.

Figure 10A:
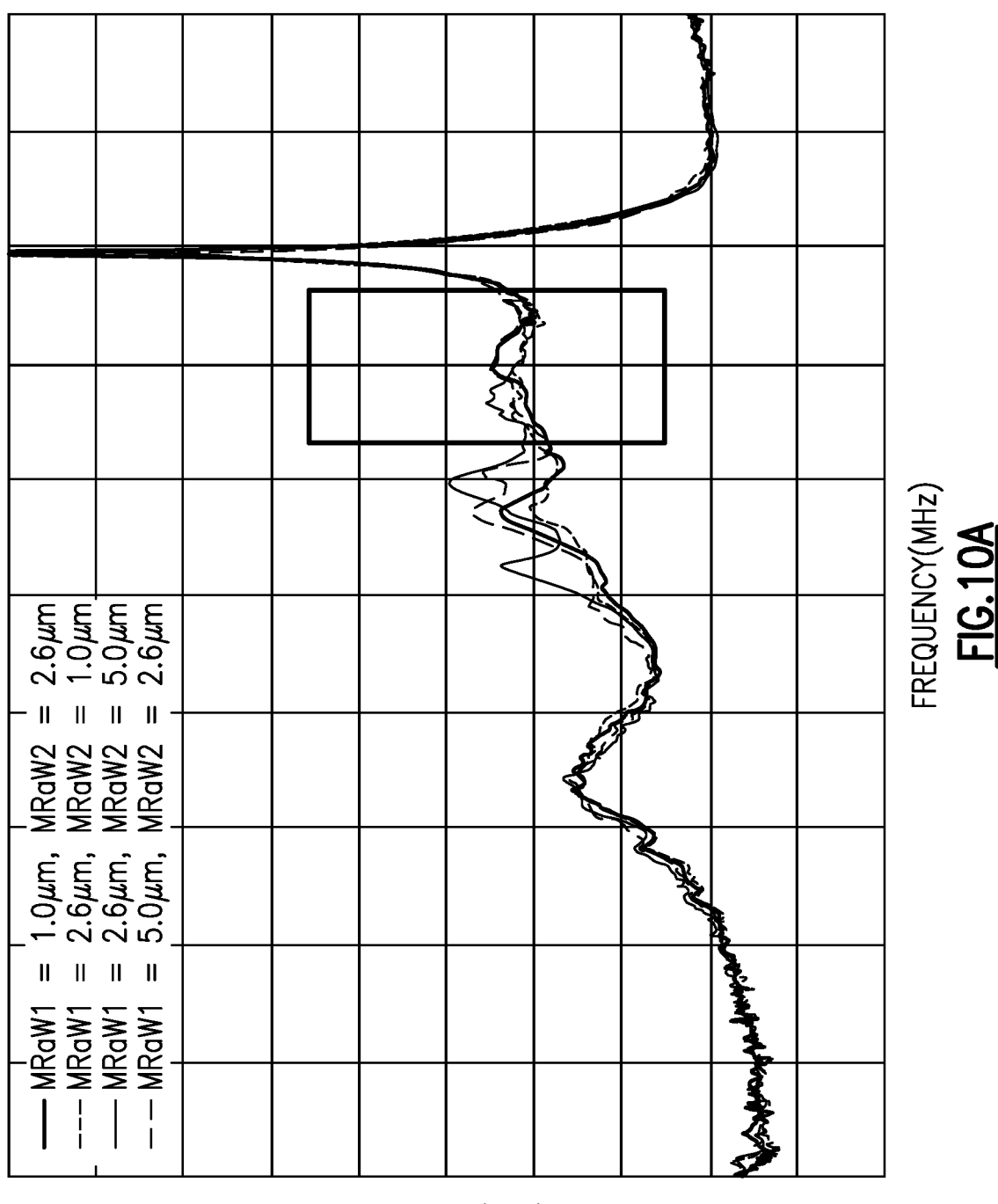
FIG. 10A illustrates the effect of changes to metal raised frame widths on admittance in an example of an SMR.
Figure 10B:
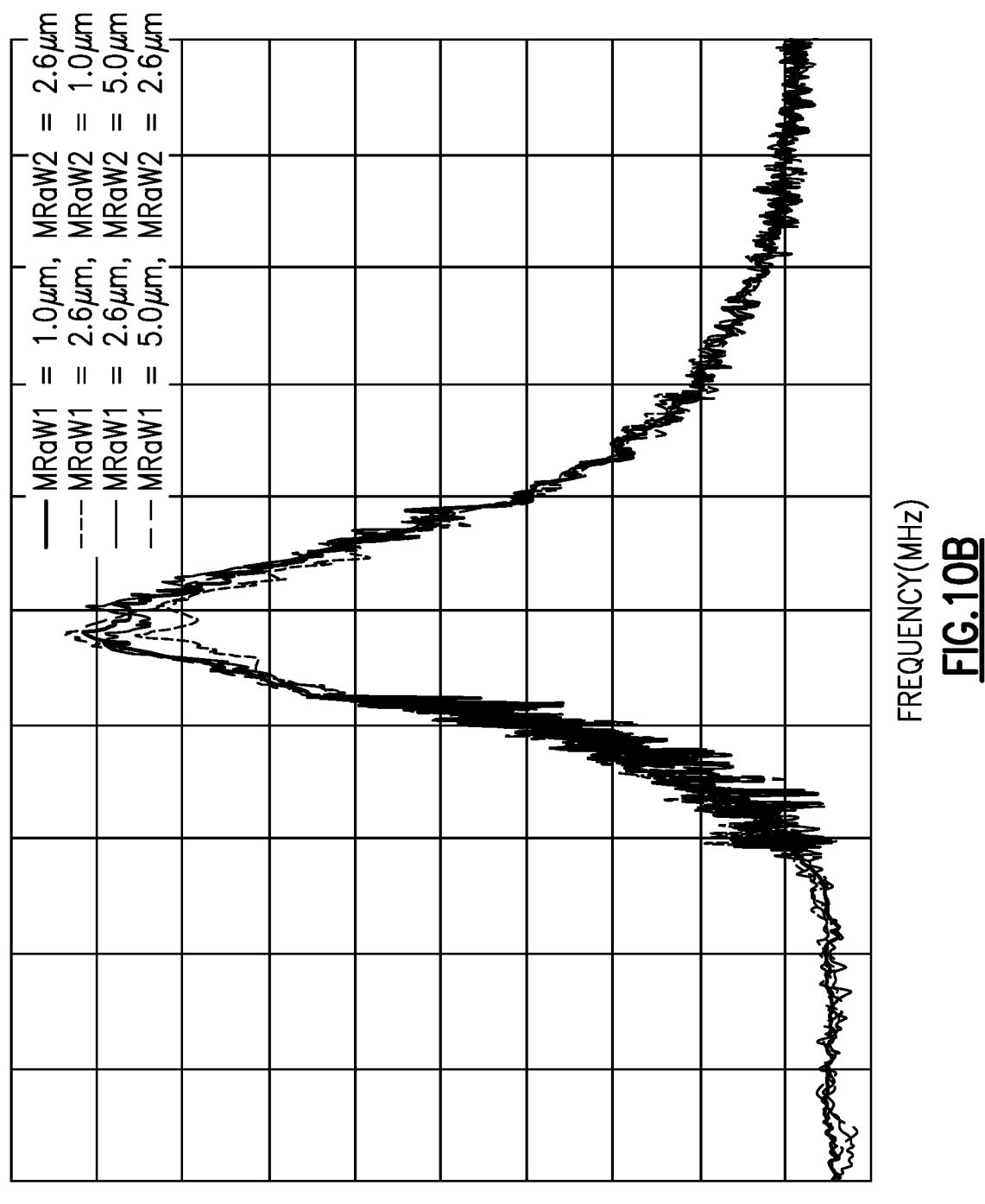
FIG. 10B illustrates the effect of changes to metal raised frame widths on quality factor in an example of an SMR.
Figure 10C:
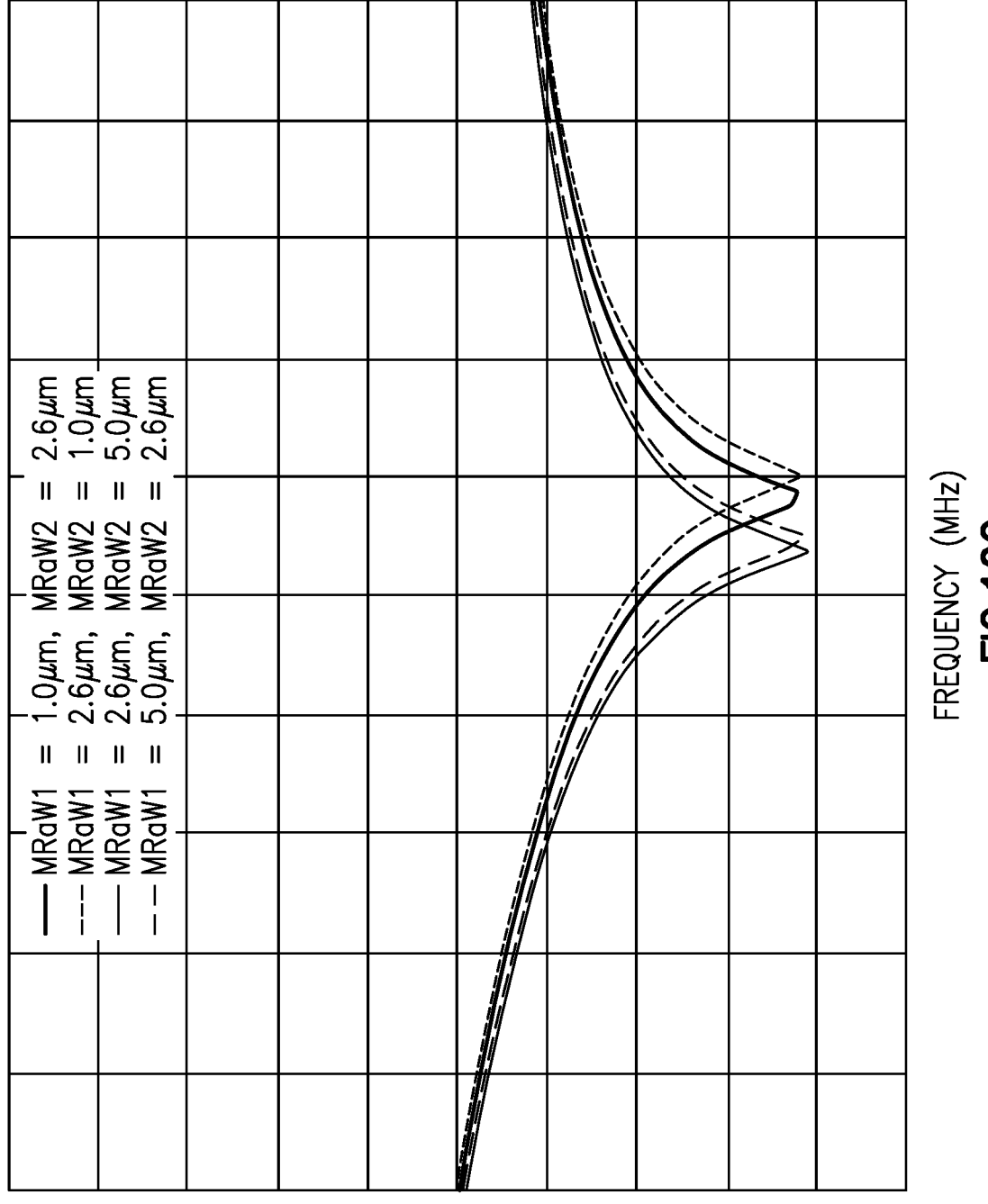
FIG. 10C illustrates the effect of changes to metal raised frame widths on coupling coefficient in an example of an SMR.

FIGS. 10A-10C illustrates the effect of changes to metal raised frame widths MRaW1 and MRaW2 on admittance, quality factor, and coupling coefficient in an example of an SMR. FIG. 10A illustrates that in the indicated region below the resonance frequency, the different combinations of metal raised frame widths may cause the SMR to exhibit different admittance values. When an SMR is used in different implementations, for example, high bandwidth implementations or in implementations in which carrier aggregation loading is of concern, one may wish the admittance characteristics below the resonance frequency to be different. FIG. 10A illustrates that by selecting different combinations of metal raised frame widths, the admittance characteristics below the resonance frequency may be tuned. As illustrated in FIG. 10B, quality factor is not significantly effected by the selection of different combinations of metal raised frame widths, which indicates that the tuning of the admittance characteristics by adjustment of the different metal raised frame widths may be accomplished without significant penalties with respect to quality factor. FIG. 10C illustrates that the antiresonance frequency, which has an effect on coupling factor of the SMR may also be adjusted by selection of different combinations of metal raised frame widths.

Figure 11:
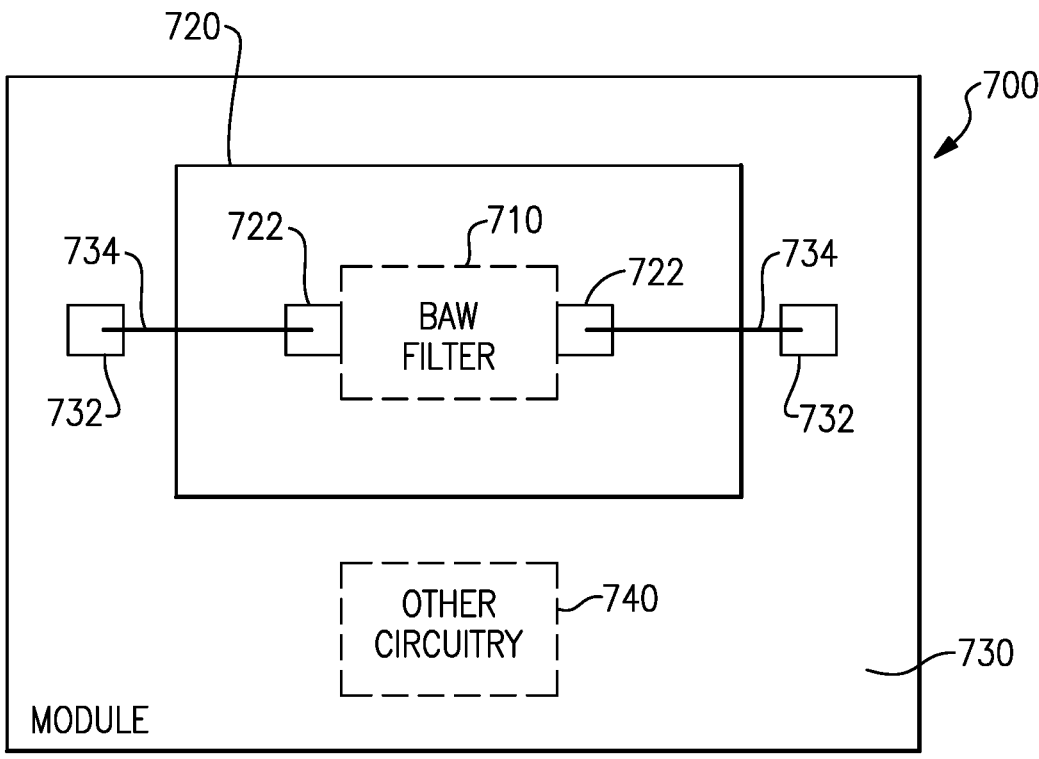
FIG. 11 is a block diagram of one example of a filter module that can include one or more acoustic wave elements according to aspects of the present disclosure.
Figures 12, 13:
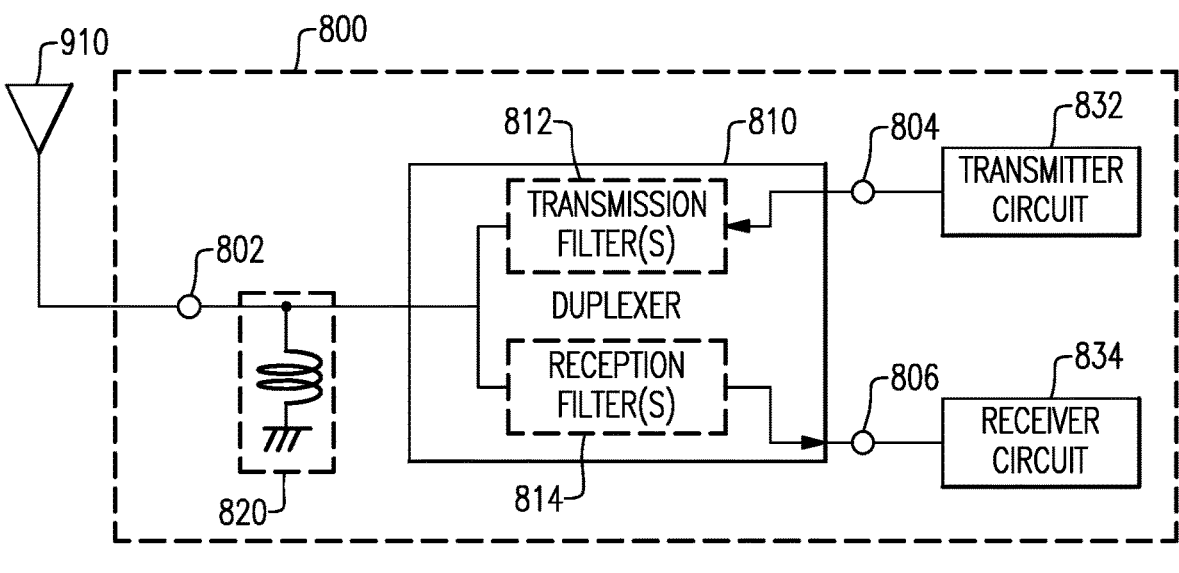
FIG. 12 is a block diagram of one example of a front-end module that can include one or more filter modules according to aspects of the present disclosure.
FIG. 13 is a block diagram of one example of a wireless device including the front-end module of FIG. 12.

The acoustic wave devices discussed herein can be implemented in a variety of packaged modules. Some example packaged modules will now be discussed in which any suitable principles and advantages of the packaged acoustic wave devices discussed herein can be implemented. FIGS. 11, 12, and 13 are schematic block diagrams of illustrative packaged modules and devices according to certain embodiments.

As discussed above, embodiments of the disclosed BAW resonators can be configured as or used in filters, for example. In turn, a BAW filter using one or more BAW resonator elements may be incorporated into and packaged as a module that may ultimately be used in an electronic device, such as a wireless communications device, for example. FIG. 11 is a block diagram illustrating one example of a module 700 including a BAW filter 710. The BAW filter 710 may be implemented on one or more die(s) 720 including one or more connection pads 722. For example, the BAW filter 710 may include a connection pad 722 that corresponds to an input contact for the BAW filter and another connection pad 722 that corresponds to an output contact for the BAW filter. The packaged module 700 includes a packaging substrate 730 that is configured to receive a plurality of components, including the die 720. A plurality of connection pads 732 can be disposed on the packaging substrate 730, and the various connection pads 722 of the BAW filter die 720 can be connected to the connection pads 732 on the packaging substrate 730 via electrical connectors 734, which can be solder bumps or wirebonds, for example, to allow for passing of various signals to and from the BAW filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 12, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 12, however in other embodiments these components may be integrated into a common transceiver circuit or module. As will be appreciated by those skilled in the art, the front-end module 800 may include other components that are not illustrated in FIG. 12 including, but not limited to, switches, electromagnetic couplers, amplifiers, processors, and the like.

FIG. 13 is a block diagram of one example of a wireless device 900 including the antenna duplexer 810 shown in FIG. 12. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 12. The front-end module 800 includes the duplexer 810, as discussed above. In the example shown in FIG. 13 the front-end module 800 further includes an antenna switch 840, which can be configured to switch between different frequency bands or modes, such as transmit and receive modes, for example. In the example illustrated in FIG. 13, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 12.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 800 may further include a low noise amplifier module 860, which amplifies received signals from the antenna 910 and provides the amplified signals to the receiver circuit 834 of the transceiver 830.

The wireless device 900 of FIG. 13 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave resonator device comprising:
a piezoelectric material layer having an upper surface and a lower surface;
a first metal layer having a lower surface disposed on the upper surface of the piezoelectric material layer and an upper surface;

14 a second metal layer having an upper surface disposed on the lower surface of the piezoelectric material layer and a lower surface;
an oxide raised frame surrounding a central active region of the bulk acoustic wave resonator device, the oxide raised frame defined in an oxide raised frame region by a layer of dielectric material disposed between the lower surface of the first metal layer and the upper surface of the second metal layer and a first portion of a third metal layer disposed on the upper surface of the first metal layer;
a metal raised frame disposed on the upper surface of the first metal layer and surrounding the central active region, the metal raised frame defined in a metal raised frame region by a second portion of the third metal layer disposed on the upper surface of the first metal layer, no layer of dielectric material being disposed between the lower surface of the first metal layer and the upper surface of the piezoelectric material layer or between the upper surface of the second metal layer and the lower surface of the piezoelectric material layer in the metal raised frame region, the second portion of the third metal layer including a first region proximate the central active region in which an upper surface of the second portion of the third metal layer is upwardly tapered, a second region disposed on an opposite side of the first region from the central active region in which the upper surface of the second portion of the third metal layer is planar and parallel to the upper surface of the piezoelectric material layer, and a third region on an opposite side of the second region from the first region in which the upper surface of the second portion of the third metal layer is upwardly tapered, the central active region having a first side and a second side, the oxide raised frame having a width on the first side of the central active region that is different from the width of the oxide raised frame on the second side of the central active region to improve an operating parameter of the bulk acoustic wave resonator; and
a passivation layer disposed on an upper surface of the metal raised frame and on the upper surface of the first metal layer, a recessed frame region being defined by thinned portions of the passivation layer that define an outer boundary of the central active region.

2. The bulk acoustic wave resonator device of claim 1 further comprising:
an interconnect electrically coupled to the first metal layer disposed on the first side of the central active region on an opposite side of the metal raised frame from the central active region; and
an interconnect electrically coupled to the second metal layer disposed on the second side of the central active region on an opposite side of the metal raised frame from the central active region.

3. The bulk acoustic wave resonator device of claim 2 wherein the metal raised frame has a width on the first side of the central active region that is substantially the same as a width of the metal raised frame on the second side of the central active region.

4. The bulk acoustic wave resonator device of claim 2 wherein the width of the oxide raised frame on the second side of the central active region is greater than the width of the oxide raised frame on the first side of the central active region.

5. The bulk acoustic wave resonator device of claim 4 wherein the central active region includes at least one additional side, the width of the oxide raised frame on the at least one additional side of the central active region being substantially the same as the width of the oxide raised frame on the second side of the central active region.

6. The bulk acoustic wave resonator device of claim 2 wherein the width of the metal raised frame on the first side of the central active region is greater than the width of the oxide raised frame on the first side of the central active region.

7. The bulk acoustic wave resonator device of claim 2 wherein the width of the metal raised frame on the first side of the central active region is different from the width of the metal raised frame on the second side of the central active region.

8. The bulk acoustic wave resonator device of claim 7 wherein the width of the metal raised frame on the first side of the central active region is greater than the width of the metal raised frame on the second side of the central active region.

9. A bulk acoustic wave resonator device comprising:

a piezoelectric material layer having an upper surface and a lower surface;

a first metal layer having a lower surface disposed on the upper surface of the piezoelectric material layer and an upper surface;

a second metal layer having an upper surface disposed on the lower surface of the piezoelectric material layer and a lower surface;

an oxide raised frame surrounding a central active region of the bulk acoustic wave resonator device, the oxide raised frame defined in an oxide raised frame region by a layer of dielectric material disposed between the lower surface of the first metal layer and the upper surface of the second metal layer and a first portion of a third metal layer disposed on the upper surface of the first metal layer; and a metal raised frame disposed on the upper surface of the first metal layer and surrounding the central active region of the bulk acoustic wave resonator device, the metal raised frame defined in a metal raised frame region by a second portion of the third metal layer disposed on the upper surface of the first metal layer, no layer of dielectric material being disposed between the lower surface of the first metal layer and the upper surface of the piezoelectric material layer or between the upper surface of the second metal layer and the lower surface of the piezoelectric material layer in the metal raised frame region, the second portion of the third metal layer including a first region proximate the central active region in which an upper surface of the second portion of the third metal layer is upwardly tapered, a second region disposed on an opposite side of the first region from the central active region in which the upper surface of the second portion of the third metal layer is planar and parallel to the upper surface of the piezoelectric material layer, and a third region on an opposite side of the second region from the first region in which the upper surface of the second portion of the third metal layer is upwardly tapered, the central active region having a first side and a second side, the metal raised frame having a width on the first side of the central active region that is different from a width of the metal raised frame on the second side of the central active region to improve an operating parameter of the bulk acoustic wave resonator.

10. The bulk acoustic wave resonator device of claim 9 further comprising:

an interconnect electrically coupled to the first metal layer disposed on the first side of the central active region on an opposite side of the metal raised frame from the central active region; and an interconnect electrically coupled to the second metal layer disposed on the second side of the central active region on an opposite side of the metal raised frame from the central active region.

11. The bulk acoustic wave resonator device of claim 9 wherein the width of the oxide raised frame on the first side of the central active region is greater than the width of the metal raised frame on the first side of the central active region.

12. The bulk acoustic wave resonator device of claim 9 wherein the width of the oxide raised frame on the first side of the central active region is different from the width of the oxide raised frame on the second side of the central active region.

13. The bulk acoustic wave resonator device of claim 12 wherein the width of the oxide raised frame on the second side of the central active region is greater than the width of the oxide raised frame on the first side of the central active region.

14. The bulk acoustic wave resonator device of claim 9 wherein the oxide raised frame has a width on the first side of the central active region that is substantially the same as a width of the oxide raised frame on the second side of the central active region.

15. The bulk acoustic wave resonator device of claim 9 wherein the width of the metal raised frame on the second side of the central active region is greater than the width of the metal raised frame on the first side of the central active region.

16. The bulk acoustic wave resonator device of claim 9 wherein the central active region includes at least one additional side, the width of the metal raised frame on the at least one additional side of the central active region being substantially the same as the width of the metal raised frame on the second side of the central active region.

17. A radio frequency filter including the bulk acoustic wave resonator device of claim 9.

18. A radio frequency module including the radio frequency filter of claim 17.

19. A radio frequency device including the radio frequency module of claim 18.

* * * * *